(12) United States Patent
Yoshida et al.

(10) Patent No.: US 9,905,719 B2
(45) Date of Patent: Feb. 27, 2018

(54) MULTI-JUNCTION SOLAR CELL, PHOTOELECTRIC CONVERSION DEVICE, AND COMPOUND-SEMICONDUCTOR-LAYER LAMINATION STRUCTURE

(75) Inventors: Hiroshi Yoshida, Kanagawa (JP); Masao Ikeda, Kanagawa (JP); Shiro Uchida, Tokyo (JP); Takashi Tange, Kanagawa (JP); Masaru Kuramoto, Kanagawa (JP); Masayuki Arimochi, Jiangsu (CN); Hui Yang, Jiangsu (CN); Shulong Lu, Jiangsu (CN); Xinhe Zheng, Jiangsu (CN)

(73) Assignee: Sony Corporation, Tokyo (JP)

( * ) Notice: Subject to any disclaimer, the term of this patent is extended or adjusted under 35 U.S.C. 154(b) by 748 days.

(21) Appl. No.: 14/345,001

(22) PCT Filed: Sep. 3, 2012

(86) PCT No.: PCT/JP2012/072331
§ 371 (c)(1),
(2), (4) Date: Jun. 5, 2014

(87) PCT Pub. No.: WO2013/042526
PCT Pub. Date: Mar. 28, 2013

(65) Prior Publication Data
US 2014/0345680 A1 Nov. 27, 2014

(30) Foreign Application Priority Data
Sep. 21, 2011 (CN) .......................... 2011 1 0281329

(51) Int. Cl.
*H01L 31/0687* (2012.01)
*H01L 31/0352* (2006.01)
*H01L 31/0304* (2006.01)

(52) U.S. Cl.
CPC .... *H01L 31/0687* (2013.01); *H01L 31/03046* (2013.01); *H01L 31/0352* (2013.01); *H01L 31/06875* (2013.01); *Y02E 10/544* (2013.01)

(58) Field of Classification Search
CPC ............ H01L 31/0352; H01L 31/0687; H01L 31/03046; H01L 31/06875
See application file for complete search history.

(56) References Cited

U.S. PATENT DOCUMENTS 4,688,068 A 8/1987 Chaffin et al.
4,718,947 A 1/1988 Arya
(Continued)

FOREIGN PATENT DOCUMENTS

EP 1798777 6/2007
JP 4-137769 5/1992
JP 2011-077474 4/2011

OTHER PUBLICATIONS

European Extended Search Report dated Jun. 1, 2015, for corresponding European Appln. No. 12833198.0.
(Continued)

*Primary Examiner* — Tae-Sik Kang
(74) *Attorney, Agent, or Firm* — K&L Gates LLP

(57) ABSTRACT

A multi-junction solar cell that is lattice-matched with a base, and that includes a sub-cell having a desirable band gap is provided. A plurality of sub-cells are laminated, each including first and second compound semiconductor layers. At least one predetermined sub-cell is configured of first layers and a second layer. In each of the first layers, a 1-A layer and a 1-B layer are laminated. In the second layer, a 2-A layer and a 2-B layer are laminated. A composition A of the 1-A layer and the 2-A layer is determined based on a value of a band gap of the predetermined sub-cell. A composition B of the 1-B layer and the 2-B layer is determined based on a difference between a base lattice constant
(Continued)

of the base and a lattice constant of the composition A. Thicknesses of 1-B layer and 2-B layer are determined based on difference between base lattice constant and a lattice constant of composition B, and on thickness of the 1-A layer and thickness of 2-A layer.

8 Claims, 20 Drawing Sheets

(56) References Cited

U.S. PATENT DOCUMENTS

| | | | | |
|---|---|---|---|---|
| 5,841,152 A | * | 11/1998 | Ishikawa | B82Y 20/00 257/14 |
| 5,973,339 A | * | 10/1999 | Yokouchi | H04B 10/671 250/370.14 |
| 6,150,604 A | | 11/2000 | Freundlich et al. | |
| 6,660,928 B1 | * | 12/2003 | Patton | H01L 31/0687 136/249 |
| 6,838,705 B1 | * | 1/2005 | Tanizawa | H01L 33/025 257/101 |
| 2007/0032041 A1 | * | 2/2007 | Lester | H01L 21/02458 438/455 |
| 2010/0180936 A1 | | 7/2010 | Kim | |
| 2010/0229926 A1 | * | 9/2010 | Newman | H01L 31/06875 136/255 |
| 2010/0282307 A1 | * | 11/2010 | Sharps | H01L 31/0687 136/255 |

OTHER PUBLICATIONS

James M. Zahler, et al., "Wafer Bonding and Layer Transfer Processes for High Efficiency Solar Cells", NCPV and Solar Program Review Meeting 2003. (4 pages).

* cited by examiner

[ FIG. 1 ]
(A) [STEP-330] (SUBSEQUENT STEP)
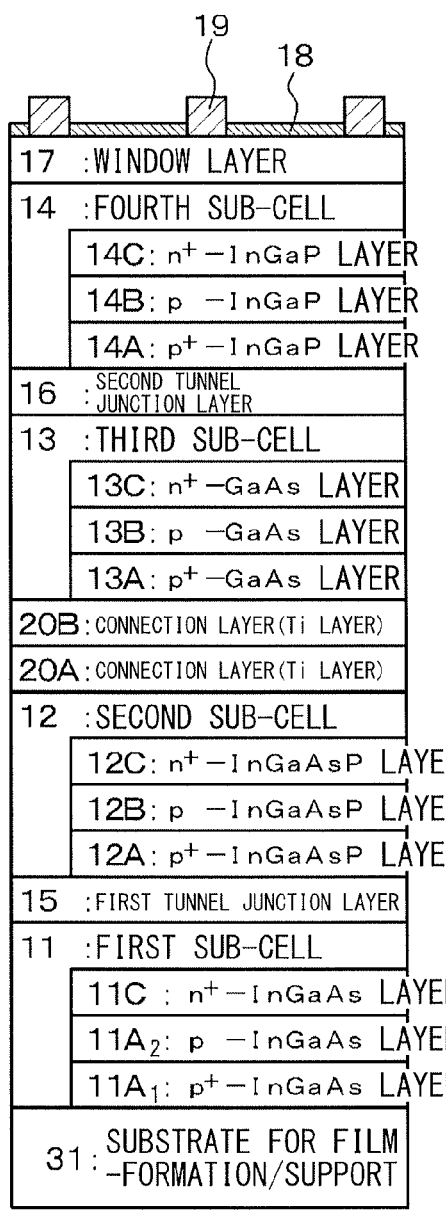
(B)

[ FIG. 2 ]
(A) [STEP-300]
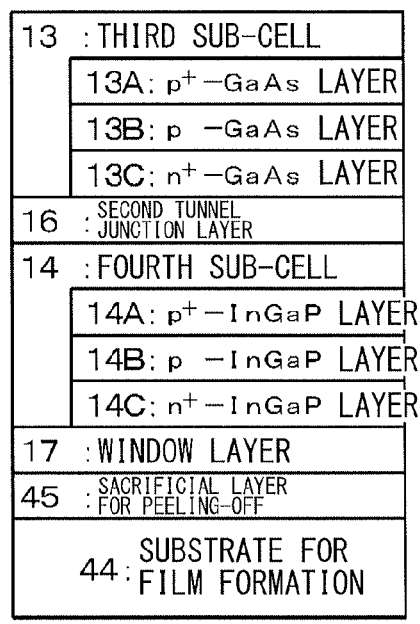
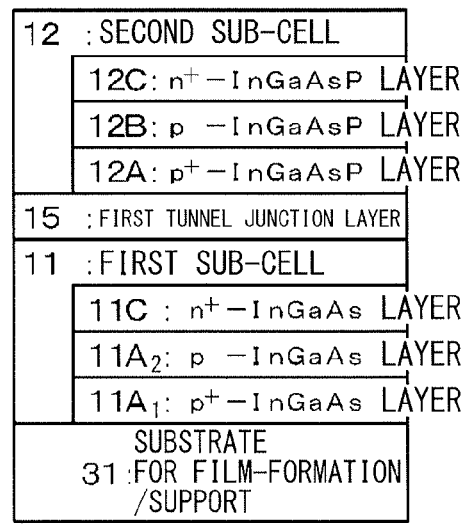
(B) [STEP-310]
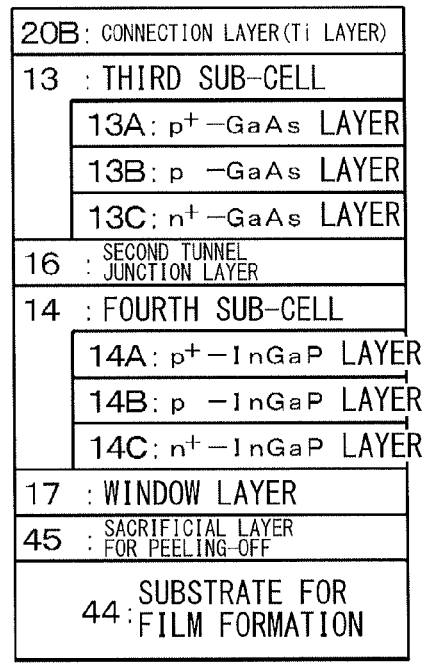
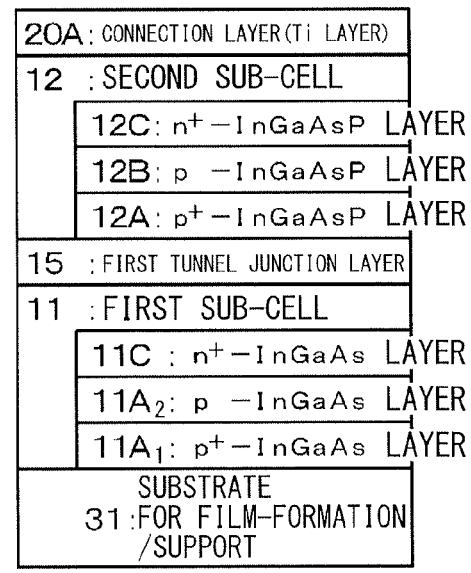

[ FIG. 3 ]
(A) [STEP-320]
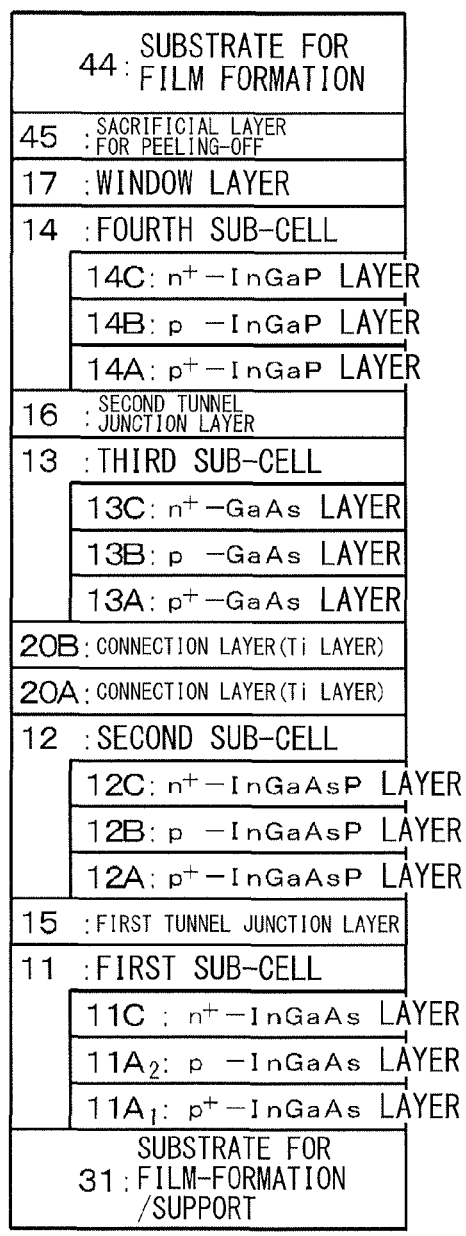
(B) [STEP-330]
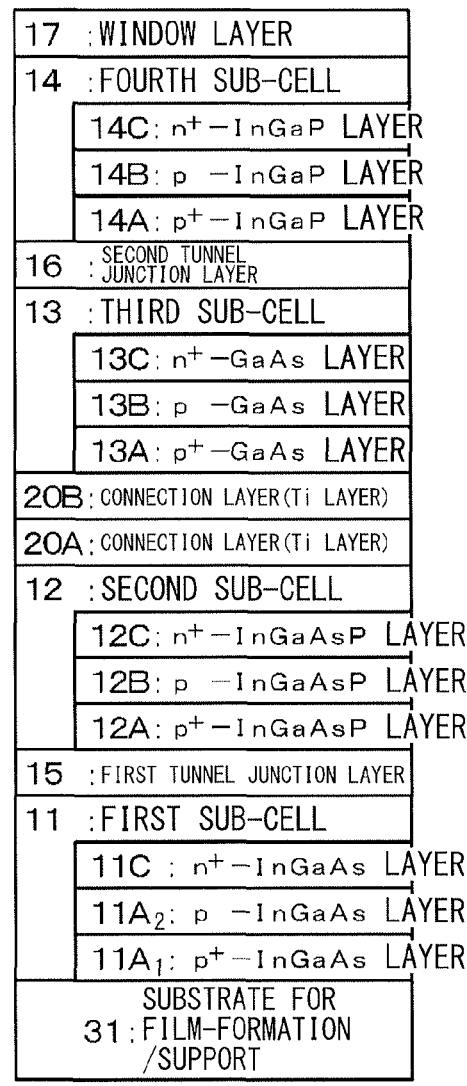

[ FIG. 4 ]
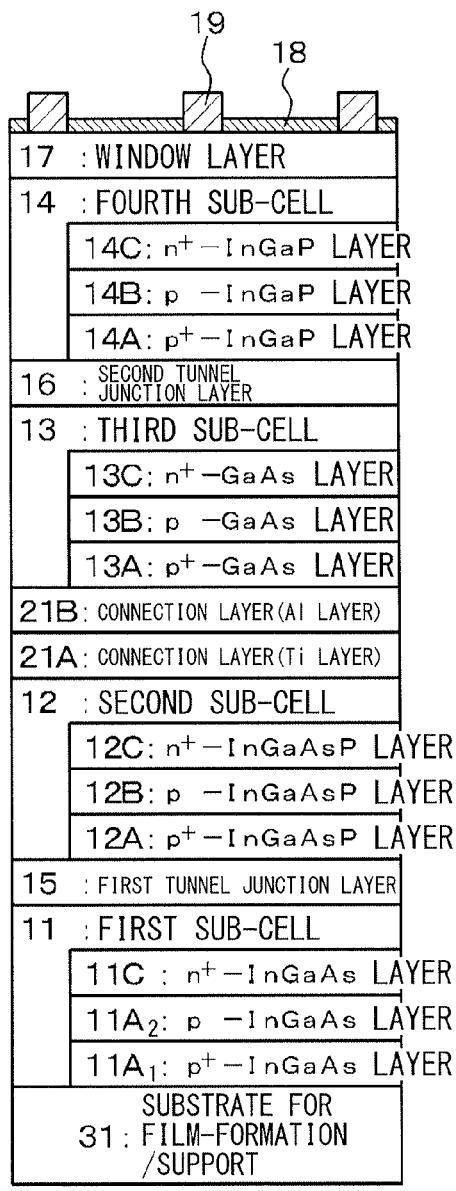
(A) [EXAMPLE 4]
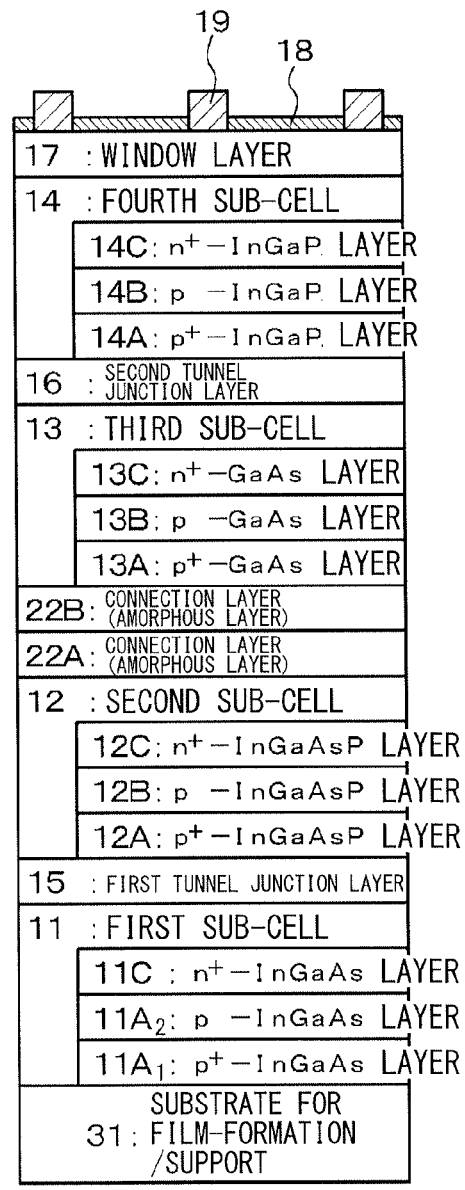
(B) [EXAMPLE 5]

[ FIG. 5 ]

(A) [STEP-600]

| 13 : THIRD SUB-CELL |
| --- |
| 13A: $p^+$-GaAs LAYER |
| 13B: p -GaAs LAYER |
| 13C: $n^+$-GaAs LAYER |
| 16 : SECOND TUNNEL JUNCTION LAYER |
| 14 : FOURTH SUB-CELL |
| 14A: $p^+$-InGaP LAYER |
| 14B: p -InGaP LAYER |
| 14C: $n^+$-InGaP LAYER |
| 17 : WINDOW LAYER |
| 46 : SECOND SACRIFICIAL LAYER FOR PEELING-OFF |
| 44 : SUBSTRATE FOR FILM FORMATION |

| 11 : FIRST SUB-CELL |
| --- |
| $11A_1$: $p^+$-InGaAs LAYER |
| $11A_2$: p -InGaAs LAYER |
| 11C : $n^+$-InGaAs LAYER |
| 15 : FIRST TUNNEL JUNCTION LAYER |
| 12 : SECOND SUB-CELL |
| 12A: $p^+$-InGaAsP LAYER |
| 12B: p -InGaAsP LAYER |
| 12C: $n^+$-InGaAsP LAYER |
| 43 : $n^+$-InP LAYER |
| 42 : FIRST SACRIFICIAL LAYER FOR PEELING-OFF |
| 41 : SUBSTRATE FOR FILM FORMATION |

(B) [STEP-610]

| 13 : THIRD SUB-CELL |
| --- |
| 13A: $p^+$-GaAs LAYER |
| 13B: p -GaAs LAYER |
| 13C: $n^+$-GaAs LAYER |
| 16 : SECOND TUNNEL JUNCTION LAYER |
| 14 : FOURTH SUB-CELL |
| 14A: $p^+$-InGaP LAYER |
| 14B: p -InGaP LAYER |
| 14C: $n^+$-InGaP LAYER |
| 17 : WINDOW LAYER |
| 46 : SECOND SACRIFICIAL LAYER FOR PEELING-OFF |
| 44 : SUBSTRATE FOR FILM FORMATION |

| 43 : $n^+$-InP LAYER |
| --- |
| 12 : SECOND SUB-CELL |
| 12C: $n^+$-InGaAsP LAYER |
| 12B: p -InGaAsP LAYER |
| 12A: $p^+$-InGaAsP LAYER |
| 15 : FIRST TUNNEL JUNCTION LAYER |
| 11 : FIRST SUB-CELL |
| 11C : $n^+$-InGaAs LAYER |
| $11A_2$: p -InGaAs LAYER |
| $11A_1$: $p^+$-InGaAs LAYER |
| 32 : SUPPORT SUBSTRATE |

[ FIG. 6 ]
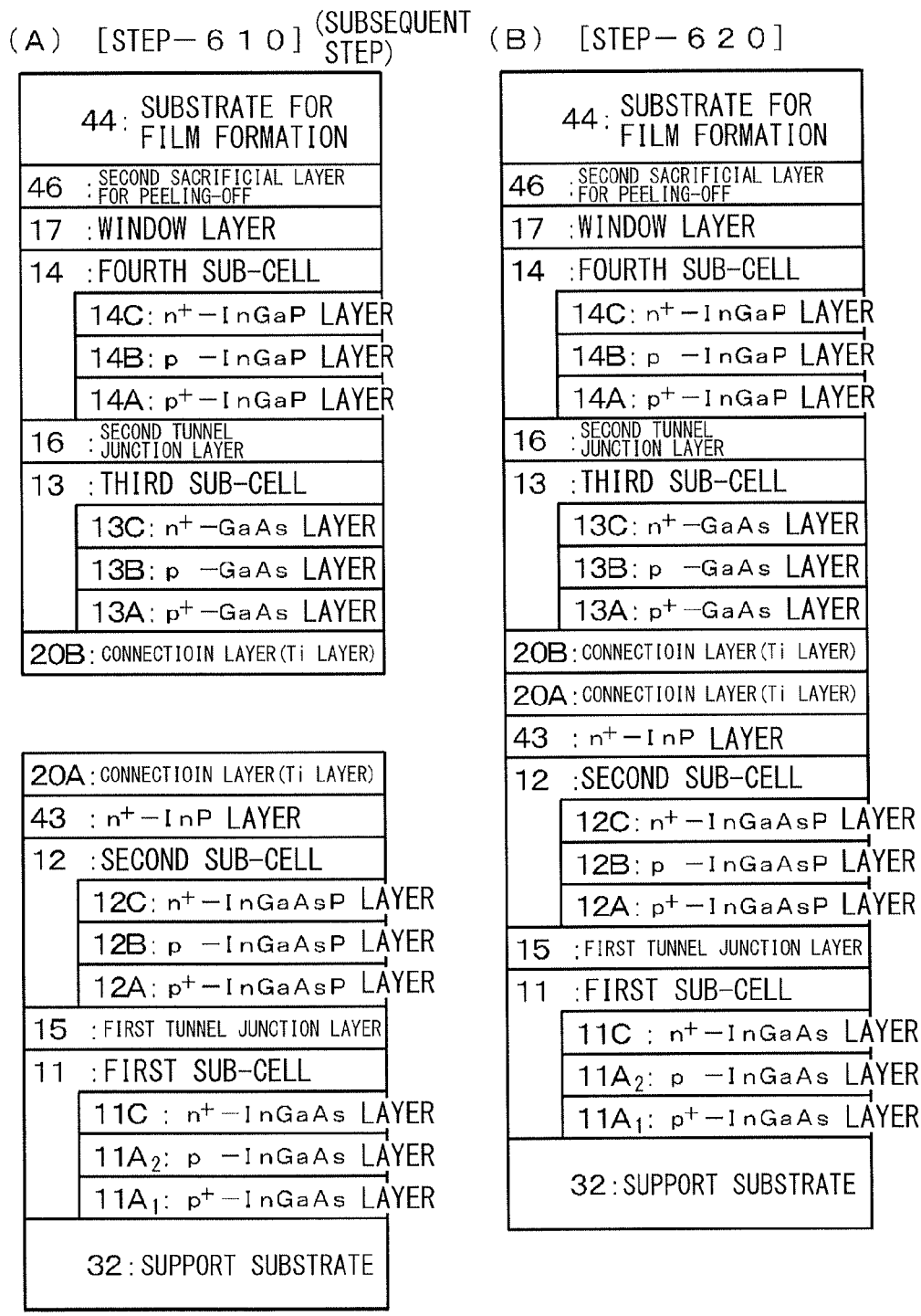

[ FIG. 7 ]
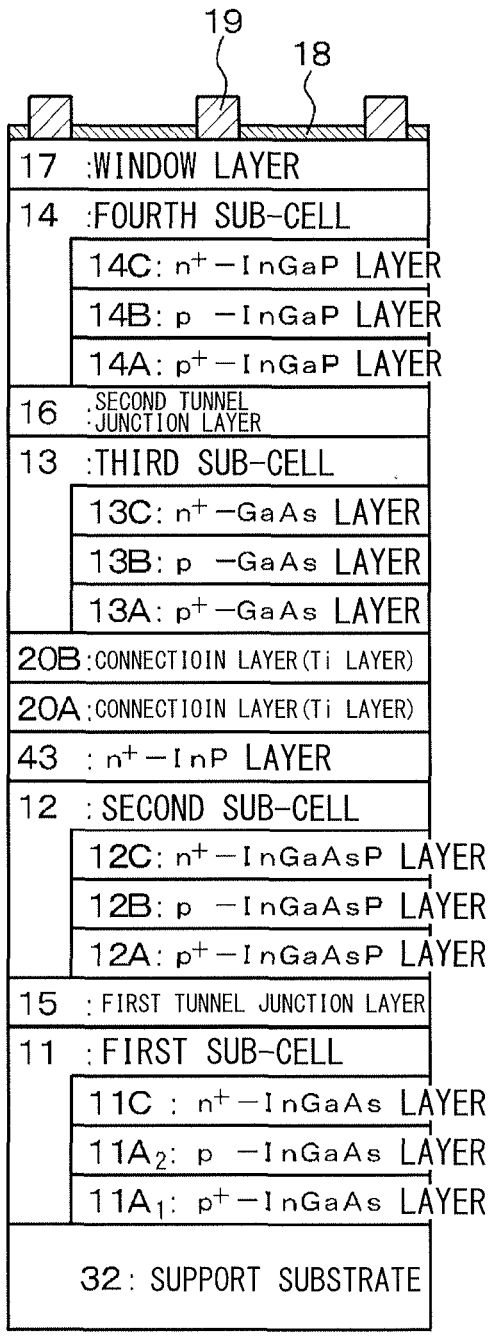
[STEP-620] (SUBSEQUENT STEP)

[ FIG. 8 ]

(A) [STEP—700]

| 47 | THIRD SACRIFICIAL LAYER : FOR PEELING-OFF |
|---|---|
| 17 | : WINDOW LAYER |
| 14 | : FOURTH SUB-CELL |
| | 14C: $n^+$—InGaP LAYER |
| | 14B: $p$ —InGaP LAYER |
| | 14A: $p^+$—InGaP LAYER |
| 16 | : SECOND TUNNEL JUNCTION LAYER |
| 13 | : THIRD SUB-CELL |
| | 13C: $n^+$—GaAs LAYER |
| | 13B: $p$ —GaAs LAYER |
| | 13A: $p^+$—GaAs LAYER |
| 46 | : SECOND SACRIFICIAL LAYER : FOR PEELING-OFF |
| 44 | : SUBSTRATE FOR FILM FORMATION |

| 11 | : FIRST SUB-CELL |
|---|---|
| | $11A_1$: $p^+$—InGaAs LAYER |
| | $11A_2$: $p$ —InGaAs LAYER |
| | 11C : $n^+$—InGaAs LAYER |
| 15 | : FIRST TUNNEL JUNCTION LAYER |
| 12 | : SECOND SUB-CELL |
| | 12A: $p^+$—InGaAsP LAYER |
| | 12B: $p$ —InGaAsP LAYER |
| | 12C: $n^+$—InGaAsP LAYER |
| 43 | : $n^+$—InP LAYER |
| 42 | : FIRST SACRIFICIAL LAYER : FOR PEELING-OFF |
| 41 | : SUBSTRATE FOR FILM FORMATION |

(B) [STEP—710]

| 47 | THIRD SACRIFICIAL LAYER : FOR PEELING-OFF |
|---|---|
| 17 | : WINDOW LAYER |
| 14 | : FOURTH SUB-CELL |
| | 14C: $n^+$—InGaP LAYER |
| | 14B: $p$ —InGaP LAYER |
| | 14A: $p^+$—InGaP LAYER |
| 16 | : SECOND TUNNEL JUNCTION LAYER |
| 13 | : THIRD SUB-CELL |
| | 13C: $n^+$—GaAs LAYER |
| | 13B: $p$ —GaAs LAYER |
| | 13A: $p^+$—GaAs LAYER |

| 11 | : FIRST SUB-CELL |
|---|---|
| | $11A_1$: $p^+$—InGaAs LAYER |
| | $11A_2$: $p$ —InGaAs LAYER |
| | 11C : $n^+$—InGaAs LAYER |
| 15 | : FIRST TUNNEL JUNCTION LAYER |
| 12 | : SECOND SUB-CELL |
| | 12A: $p^+$—InGaAsP LAYER |
| | 12B: $p$ —InGaAsP LAYER |
| | 12C: $n^+$—InGaAsP LAYER |
| 43 | : $n^+$—InP LAYER |

[FIG. 9]

(A) [STEP-720]

| 47 | THIRD SACRIFICIAL LAYER :FOR PEELING-OFF |
|---|---|
| 17 | :WINDOW LAYER |
| 14 | :FOURTH SUB-CELL |
| 14C: | $n^+$-InGaP LAYER |
| 14B: | $p$ -InGaP LAYER |
| 14A: | $p^+$-InGaP LAYER |
| 16 | :SECOND TUNNEL JUNCTION LAYER |
| 13 | :THIRD SUB-CELL |
| 13C: | $n^+$-GaAs LAYER |
| 13B: | $p$ -GaAs LAYER |
| 13A: | $p^+$-GaAs LAYER |
| 20B: | CONNECTION LAYER (Ti LAYER) |

| 20A: | CONNECTION LAYER (Ti LAYER) |
|---|---|
| 43 | : $n^+$-InP LAYER |
| 12 | : SECOND SUB-CELL |
| 12C: | $n^+$-InGaAsP LAYER |
| 12B: | $p$ -InGaAsP LAYER |
| 12A: | $p^+$-InGaAsP LAYER |
| 15 | :FIRST TUNNEL JUNCTION LAYER |
| 11 | :FIRST SUB-CELL |
| 11C : | $n^+$-InGaAs LAYER |
| $11A_2$: | $p$ -InGaAs LAYER |
| $11A_1$: | $p^+$-InGaAs LAYER |

(B) [STEP-730]

| 34: | SUPPORT SUBSTRATE |
|---|---|
| 47 | THIRD SACRIFICIAL LAYER :FOR PEELING-OFF |
| 17 | :WINDOW LAYER |
| 14 | :FOURTH SUB-CELL |
| 14C: | $n^+$-InGaP LAYER |
| 14B: | $p$ -InGaP LAYER |
| 14A: | $p^+$-InGaP LAYER |
| 16 | :SECOND TUNNEL JUNCTION LAYER |
| 13 | :THIRD SUB-CELL |
| 13C: | $n^+$-GaAs LAYER |
| 13B: | $p$ -GaAs LAYER |
| 13A: | $p^+$-GaAs LAYER |
| 20B: | CONNECTION LAYER (Ti LAYER) |
| 20A: | CONNECTION LAYER (Ti LAYER) |
| 43 | : $n^+$-InP LAYER |
| 12 | : SECOND SUB-CELL |
| 12C: | $n^+$-InGaAsP LAYER |
| 12B: | $p$ -InGaAsP LAYER |
| 12A: | $p^+$-InGaAsP LAYER |
| 15 | :FIRST TUNNEL JUNCTION LAYER |
| 11 | :FIRST SUB-CELL |
| 11C : | $n^+$-InGaAs LAYER |
| $11A_2$: | $p$ -InGaAs LAYER |
| $11A_1$: | $p^+$-InGaAs LAYER |
| 33: | SUPPORT SUBSTRATE |

[ FIG. 10 ]
(A) [STEP-740]
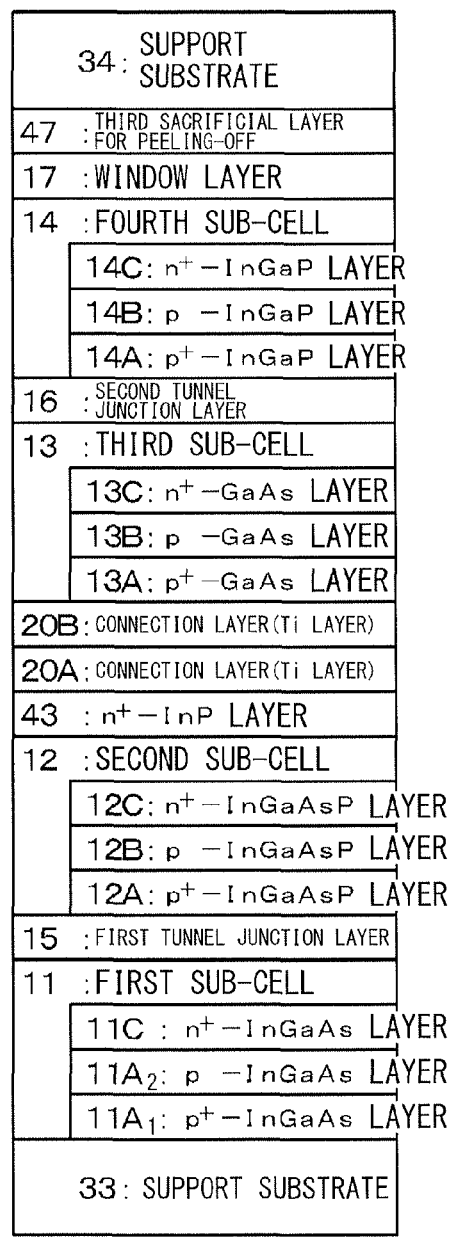
(B) [STEP-740] (SUBSEQUENT STEP)
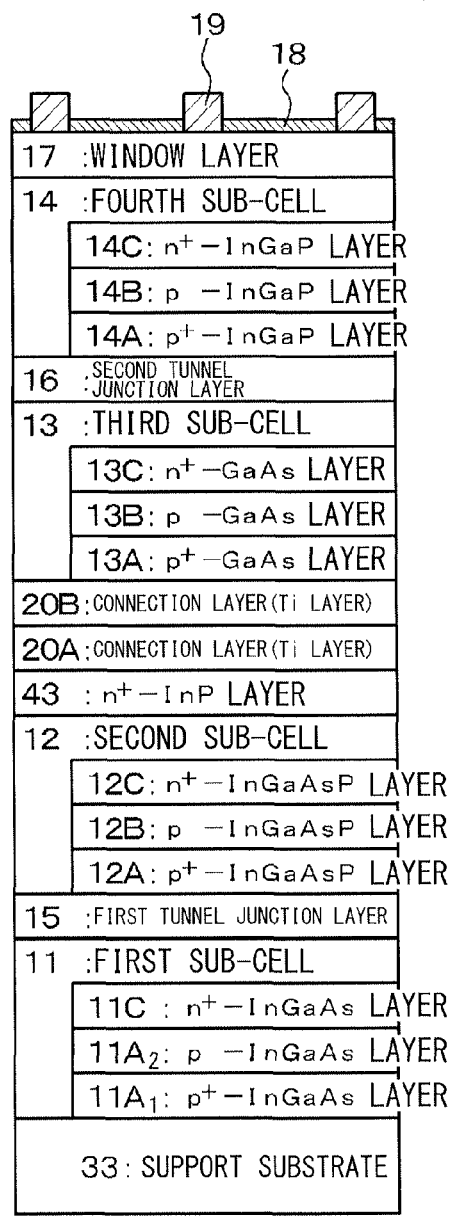

[ FIG. 11 ]
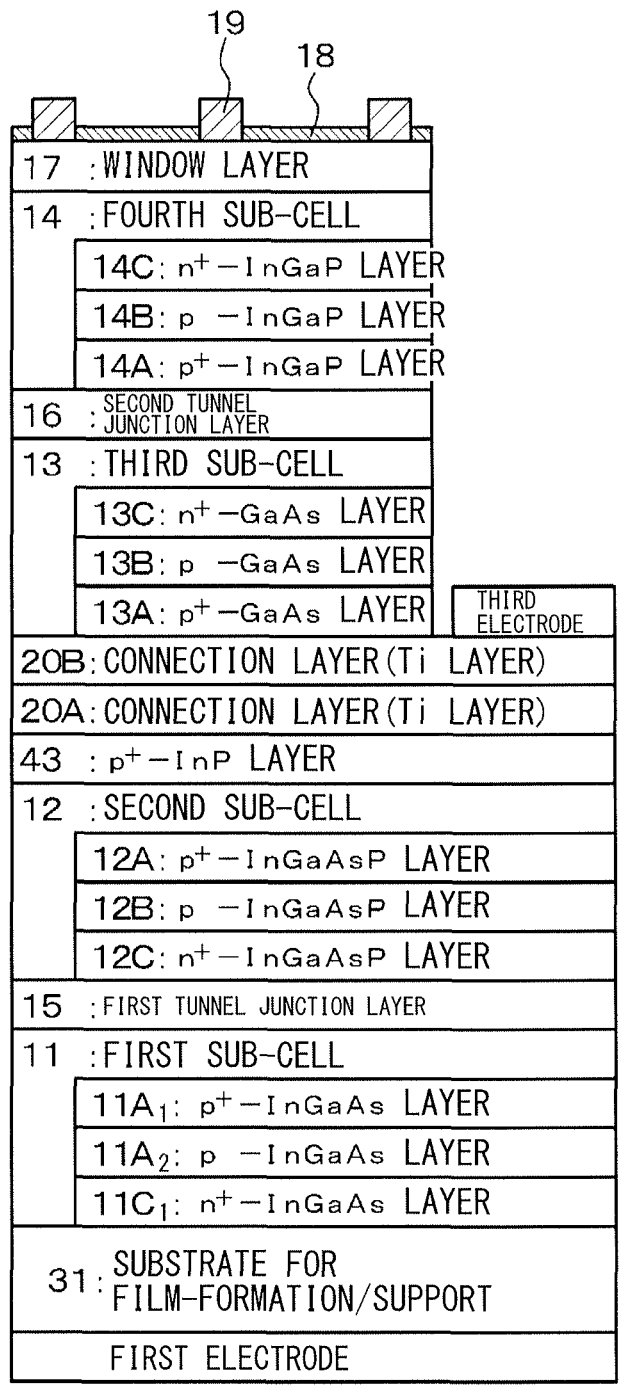

[ FIG. 12 ]
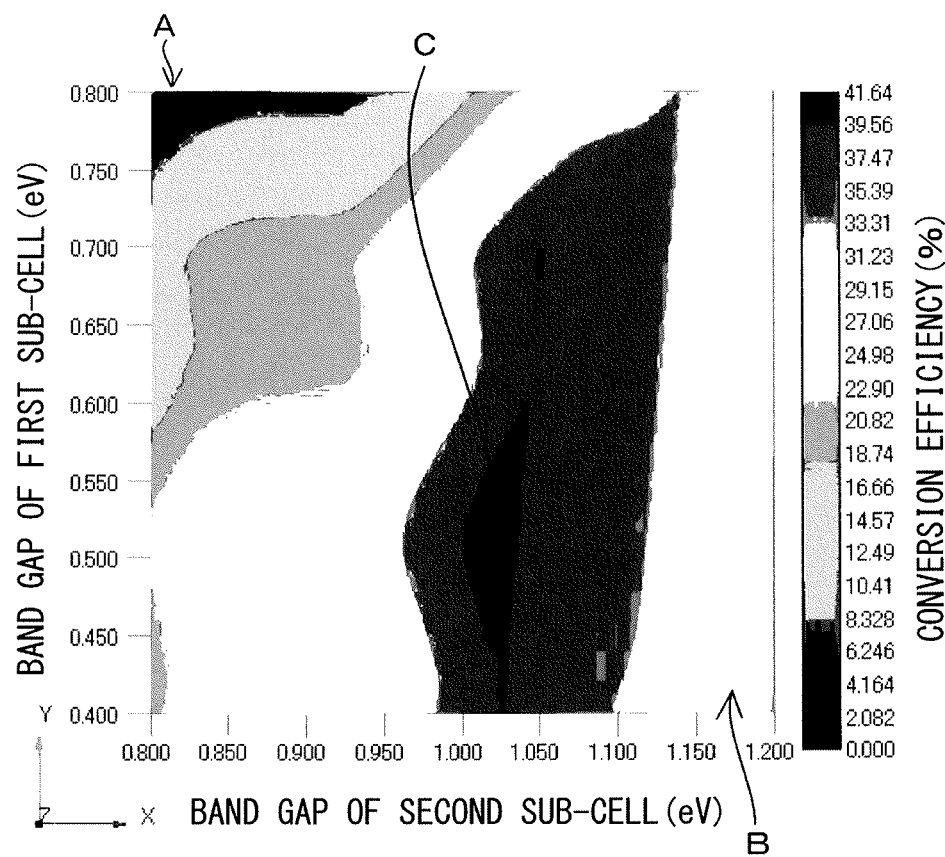

[ FIG. 13 ]
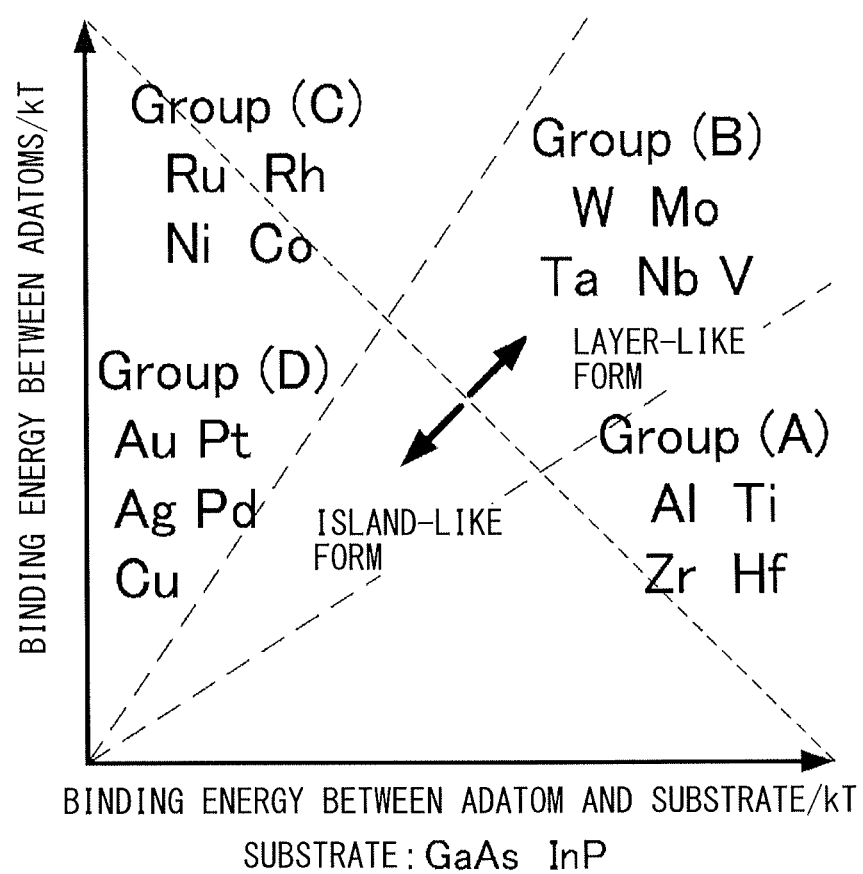

[ FIG. 14 ]
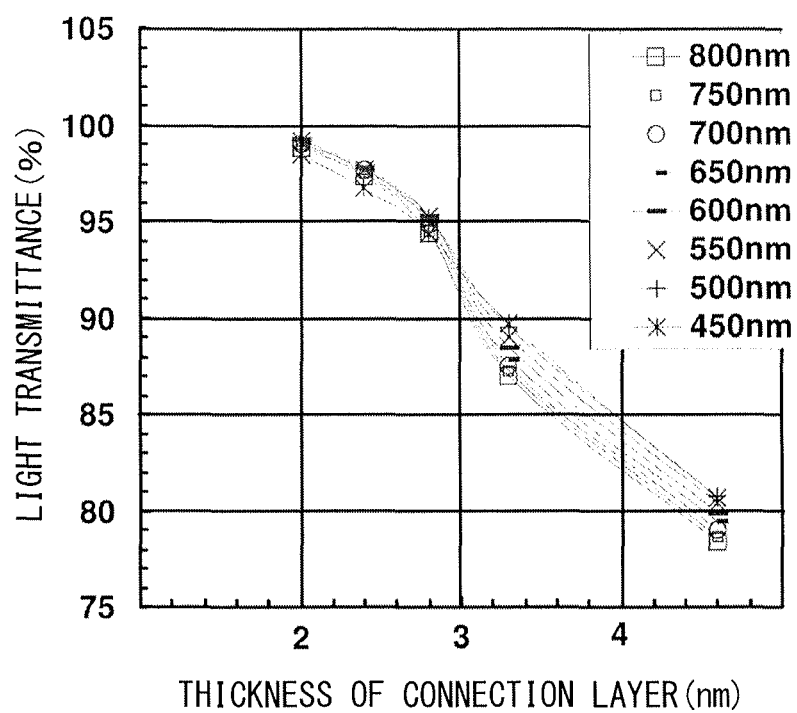

[ FIG. 15 ]

[ FIG. 16 ]
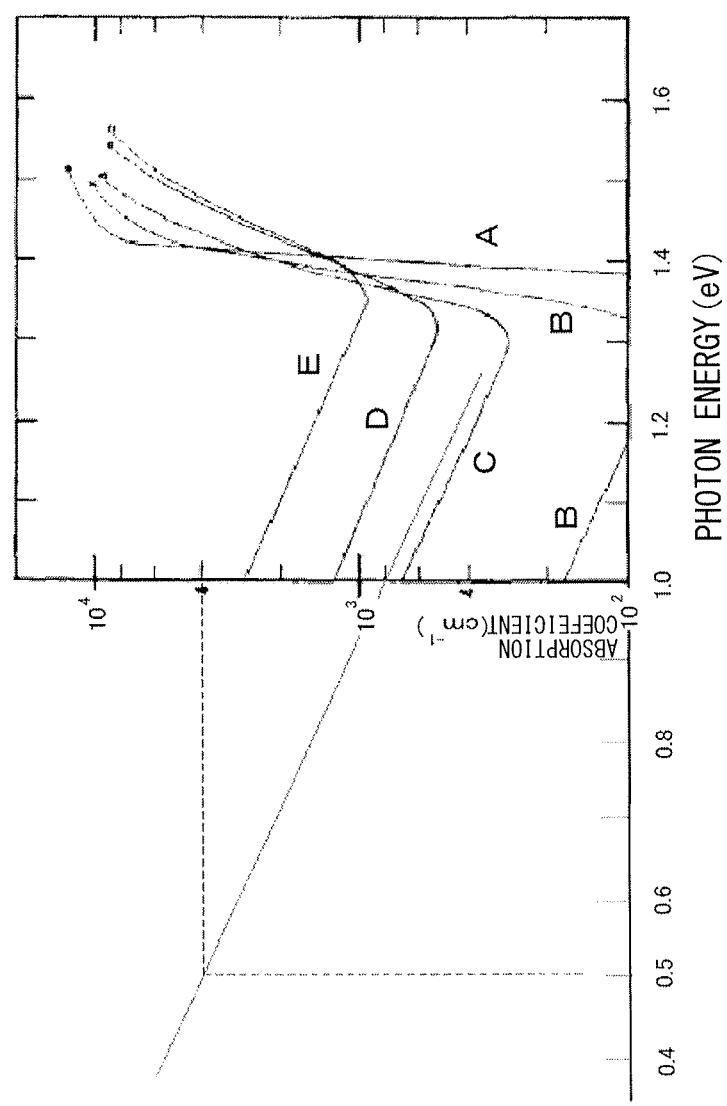

[ FIG. 17 ]
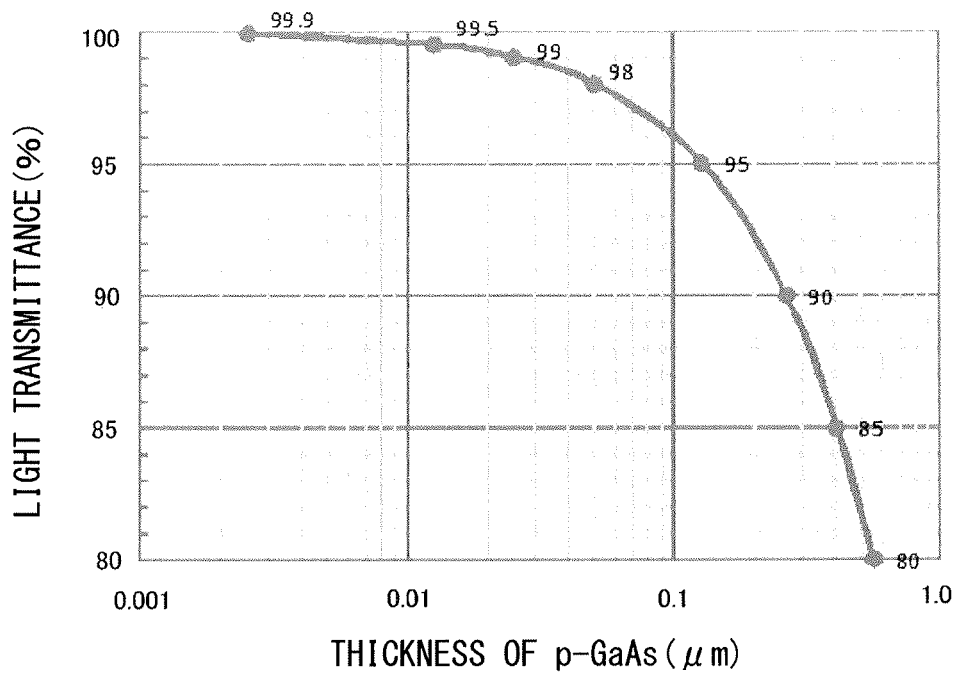
[ FIG. 18 ]
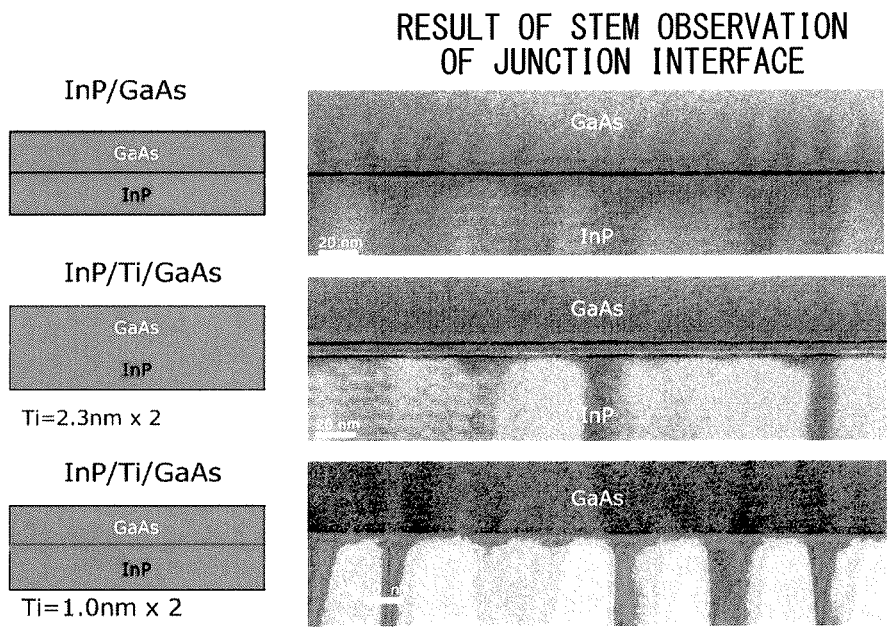

[ FIG. 19 ]
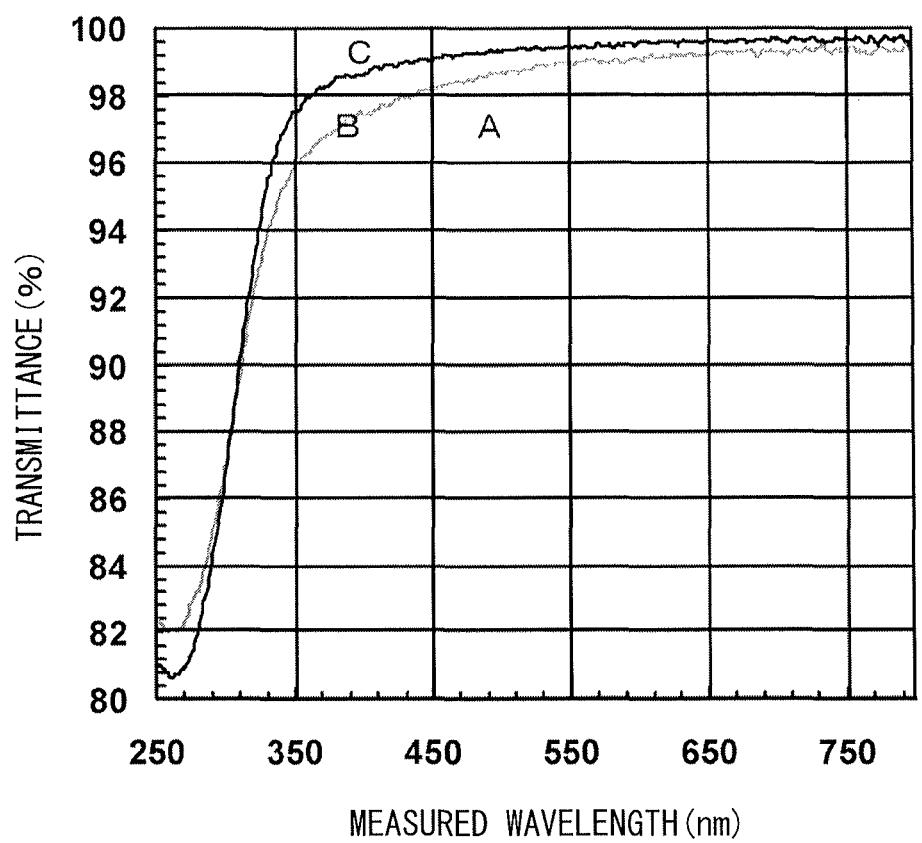

[ FIG. 20 ]
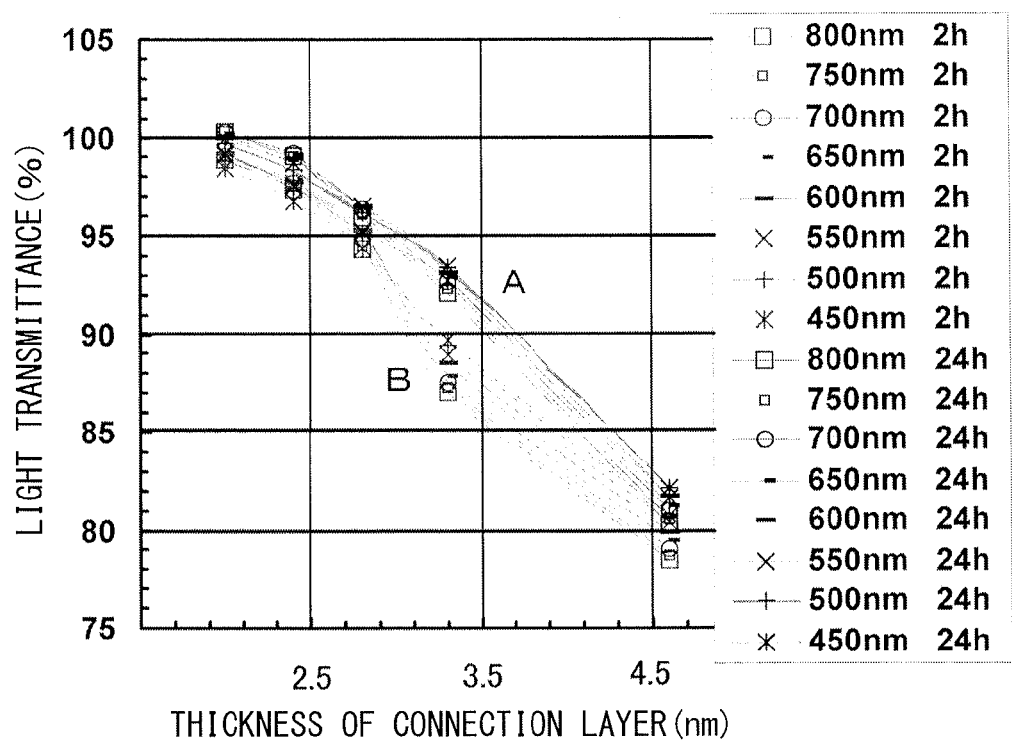

[ FIG. 21 ]
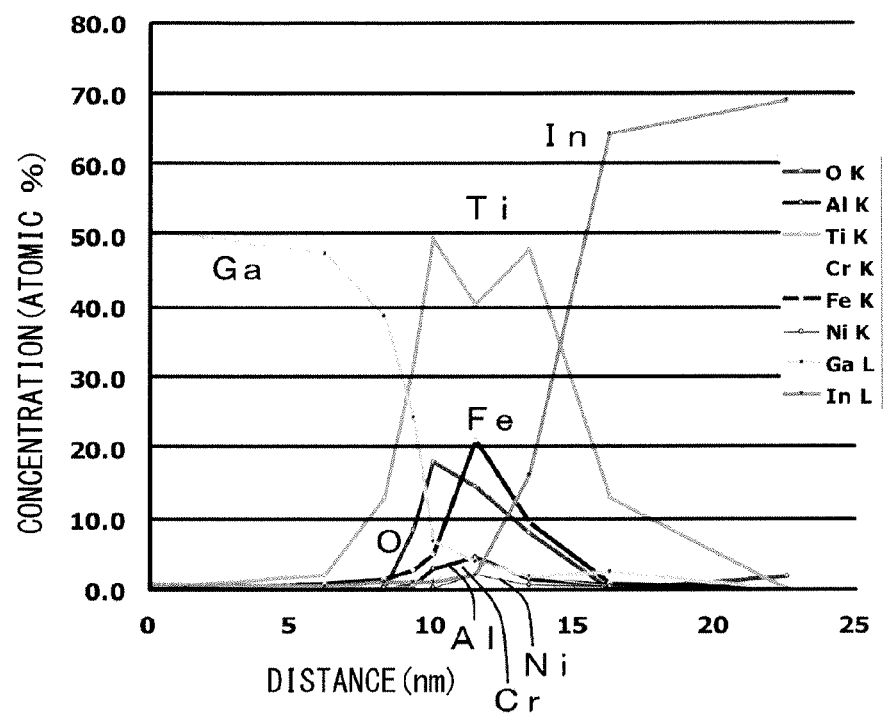
[ FIG. 22 ]
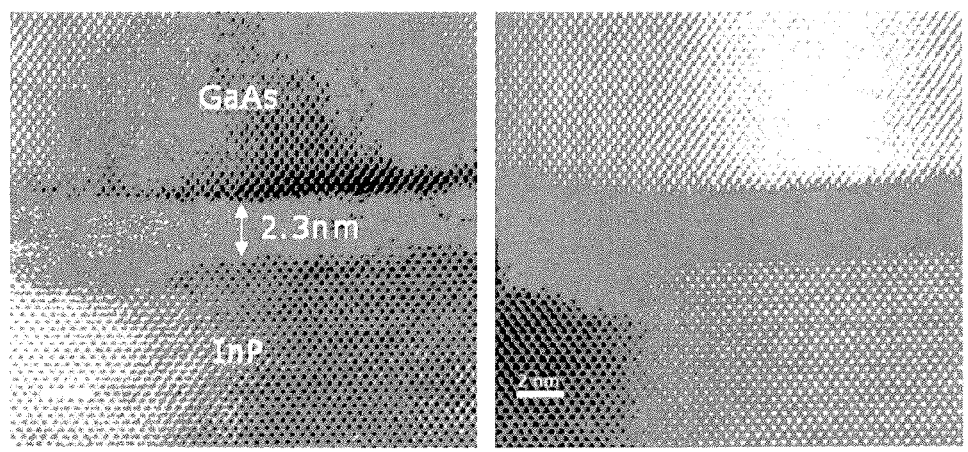

MULTI-JUNCTION SOLAR CELL, PHOTOELECTRIC CONVERSION DEVICE, AND COMPOUND-SEMICONDUCTOR-LAYER LAMINATION STRUCTURE

CROSS REFERENCES TO RELATED APPLICATIONS

The present application is a national stage of International Application No. PCT/JP2012/072331 filed on Sep. 3, 2012 and claims priority to P.R.C Patent Application No. 201110281329.6 filed in the State Intellectual Property Office of The People's Republic of China on Sep. 21, 2011, the disclosure of which is incorporated herein by reference.

BACKGROUND

The present disclosure relates to a multi-junction (also called a tandem-type, a stack-type, or a lamination-type) solar cell, a photoelectric conversion device, and a compound-semiconductor-layer lamination structure that use a compound semiconductor.

As a compound semiconductor configured of two or more types of elements, many types exist depending on a combination of the elements. Also, by laminating a lot of compound semiconductor layers made of different materials, a compound semiconductor device having various functions and various physical properties are achievable. As an example thereof, a solar cell may be mentioned. Here, as a solar cell, a silicon-based solar cell that uses silicon as a semiconductor, a compound semiconductor solar cell that uses a compound semiconductor, an organic solar cell that uses an organic material, etc. may be mentioned. In particular, the compound semiconductor solar cell has been developed aiming further improvement in energy conversion efficiency.

As a means for improving energy conversion efficiency of the compound semiconductor solar cell, there are provided a method in which a plurality of sub-cells each configured of a thin-film solar cell that is configured of a plurality of compound semiconductor layers are laminated to form a multi-junction solar cell, a method in which an effective combination of compound semiconductor materials configuring the compound semiconductor layers are searched, etc. Each of compound semiconductors such as GaAs and InP has a unique band gap, and a wavelength of light to be absorbed is different depending on this difference in band gap. Therefore, by laminating a plurality of types of sub-cells, efficiency of absorption of solar light that has a wide wavelength range is improved. In lamination, a combination of lattice constants and physical property values (such as band gaps) of crystal structures of the compound semiconductors configuring the respective sub-cells is important.

By the way, most of the multi-junction solar cells under current consideration are classified into a lattice-matched type and a lattice-mismatched type. In the lattice-matched type, compound semiconductor layers are laminated that are made of compound semiconductors having lattice constants that are almost the same with one another. In the lattice-mismatched type, compound semiconductor layers are laminated that are made of compound semiconductors having lattice constants that are different from one another with the use of metamorphic growth accompanied by dislocation. However, in the metamorphic growth method, undesirable lattice mismatch inevitably occurs, and therefore, there is an issue that quality of the compound semiconductors is significantly lowered.

On the other hand, in recent years, there has been proposed a method of manufacturing a multi-junction solar cell that utilizes a substrate bonding technique in junction of compound semiconductor layers, and a four-junction solar cell that has a structure of $In_{0.48}Ga_{0.52}P/GaAs/InGaAsP/In_{0.53}Ga_{0.47}As$ has been reported.

This substrate bonding technique is a technique to form homojunction or heterojunction between the compound semiconductor layers to be joined, and may be classified, for example, into a direct bonding scheme in which different compound semiconductor layers are bonded directly to one another (for example, see Non-patent Literature 1: "Wafer Bonding and Layer Transfer Processes for High Efficiency Solar Cells", NCPV and Solar Program Review Meeting 2003), and a scheme in which the compound semiconductor layers are joined with a connection layer in between. The substrate bonding technique has an advantage that it is not accompanied by an increase in threading dislocation. Existence of the threading dislocation leads to a not-preferable effect on electron performance of the compound semiconductor layers. In particular, the existence of the threading dislocation provides an easy diffusion path in the compound semiconductor layers as with a dopant and a recombination center, and causes a decrease in carrier density of the compound semiconductor layers. Also, the substrate bonding technique resolves the issue of lattice mismatch, and further avoids epitaxial growth caused by the lattice mismatch. Therefore, threading dislocation density that degrades the performance of the solar cell is largely reduced. In this substrate bonding technique, a covalent bonding is formed in an interface between different substances, in particular, in a hetero interface. At this time, it is important to perform a substrate junction process at a temperature by which thermal variation does not exceed a dynamic barrier necessary for progression in threading dislocation.

In junction by the direct bonding scheme, semiconductor-semiconductor bonding is performed in a nuclear scale. Therefore, transparency, heat conductivity, heat resistance, and reliability of the junction portion are superior than those in a case where junction is formed with the use of metal paste, a glass raw material (frit), etc. In this direct bonding scheme, an integrated-type or two-terminal compound semiconductor device is allowed to be integrated to a module with simplicity equivalent to that in a solar cell configured of a single-junction device, specifically, only by alloying the respective compound semiconductor layers to be laminated.

CITATION LIST

Non-Patent Literature

Non-patent Literature 1: Wafer Bonding and Layer Transfer Processes for High Efficiency Solar Cells, NCPV and Solar Program Review Meeting 2003

SUMMARY

By the way, in order to improve efficiency in utilizing solar light, it is necessary to take in solar light spectrum in a wide range. A maximum wavelength of the solar light spectrum is 2.5 μm. On the other hand, for example, in the above-described Non-patent Literature 1, the lowermost layer is configured of an InGaAs layer having a band gap of 0.72 eV, and this InGaAs layer is capable of only taking in the solar light having a wavelength of about 1.7 μm. In order to take in the solar light spectrum in a wide range, it is necessary to configure the sub-cell with the use of a compound semiconductor layer that has a further-lower band gap value. However, as long as the present inventors have examined, a technology is not known to provide a sub-cell formed of a compound semiconductor that has a desirable band gap while allowing, as a whole, a lattice constant of a base (for example, a substrate for film formation) for forming such a sub-cell to be matched with a lattice constant of the compound semiconductor that configures the sub-cell.

Therefore, it is desirable to provide a multi-junction solar cell in which lattice match is established, as a whole, with a material configuring the base and that includes a sub-cell formed of a compound semiconductor having a desirable band gap, or a photoelectric conversion device or a compound-semiconductor-layer lamination structure that includes a compound semiconductor layer.

A multi-junction solar cell according to an embodiment of the present disclosure includes a plurality of sub-cells that are laminated, in which light enters from the sub-cell located in an uppermost layer to the sub-cell located in a lowermost layer, and electric power is generated in each of the sub-cells, each of the sub-cells includes a first compound semiconductor layer and a second compound semiconductor layer that are laminated, the first compound semiconductor layer having a first conductivity type, and the second compound semiconductor layer having a second conductivity type that is different from the first conductivity type, in at least one predetermined sub-cell of the plurality of sub-cells, the first compound semiconductor layer is configured of at least one first-compound-semiconductor-layer lamination unit in which a 1-A compound semiconductor layer and a 1-B compound semiconductor layer are laminated, the second compound semiconductor layer is configured of at least one second-compound-semiconductor-layer lamination unit in which a 2-A compound semiconductor layer and a 2-B compound semiconductor layer are laminated, a compound semiconductor composition configuring the 1-A compound semiconductor layer and a compound semiconductor composition configuring the 2-A compound semiconductor layer are same compound semiconductor composition A, a compound semiconductor composition configuring the 1-B compound semiconductor layer and a compound semiconductor composition configuring the 2-B compound semiconductor layer are same compound semiconductor composition B, the compound semiconductor composition A is determined based on a value of a band gap of the predetermined sub-cell, the compound semiconductor composition B is determined based on a difference between a base lattice constant of a base used at a time of forming the first and second compound semiconductor layers and a lattice constant of the compound semiconductor composition A, a thickness of the 1-B compound semiconductor layer is determined based on a difference between the base lattice constant and a lattice constant of the compound semiconductor composition B, and on a thickness of the 1-A compound semiconductor layer, a thickness of the 2-B compound semiconductor layer is determined based on the difference between the base lattice constant and the lattice constant of the compound semiconductor composition B, and on a thickness of the 2-A compound semiconductor layer, the thicknesses of the 1-A compound semiconductor layer and the 2-A compound semiconductor layer are smaller than a critical film thickness of the compound semiconductor composition A, and are thicknesses that cause no quantum effect, and the thicknesses of the 1-B compound semiconductor layer and the 2-B compound semiconductor layer are smaller than a critical film thickness of the compound semiconductor composition B, and are thicknesses that cause no quantum effect.

A photoelectric conversion device according to an embodiment of the present disclosure includes a first compound semiconductor layer and a second compound semiconductor layer that are laminated, the first compound semiconductor layer having a first conductivity type, and the second compound semiconductor layer having a second conductivity type that is different from the first conductivity type, the first compound semiconductor layer is configured of at least one first-compound-semiconductor-layer lamination unit in which a 1-A compound semiconductor layer and a 1-B compound semiconductor layer are laminated, the second compound semiconductor layer is configured of at least one second-compound-semiconductor-layer lamination unit in which a 2-A compound semiconductor layer and a 2-B compound semiconductor layer are laminated, a compound semiconductor composition configuring the 1-A compound semiconductor layer and a compound semiconductor composition configuring the 2-A compound semiconductor layer are same compound semiconductor composition A, a compound semiconductor composition configuring the 1-B compound semiconductor layer and a compound semiconductor composition configuring the 2-B compound semiconductor layer are same compound semiconductor composition B, the compound semiconductor composition A is determined based on a value of a band gap of the photoelectric conversion device, the compound semiconductor composition B is determined based on a difference between a base lattice constant of a base used at a time of forming the first and second compound semiconductor layers and a lattice constant of the compound semiconductor composition A, a thickness of the 1-B compound semiconductor layer is determined based on a difference between the base lattice constant and a lattice constant of the compound semiconductor composition B, and on a thickness of the 1-A compound semiconductor layer, a thickness of the 2-B compound semiconductor layer is determined based on the difference between the base lattice constant and the lattice constant of the compound semiconductor composition B, and on a thickness of the 2-A compound semiconductor layer, the thicknesses of the 1-A compound semiconductor layer and the 2-A compound semiconductor layer are smaller than a critical film thickness of the compound semiconductor composition A, and are thicknesses that cause no quantum effect, and the thicknesses of the 1-B compound semiconductor layer and the 2-B compound semiconductor layer are smaller than a critical film thickness of the compound semiconductor composition B, and are thicknesses that cause no quantum effect.

A compound-semiconductor-layer lamination structure according to an embodiment of the present disclosure includes at least one compound-semiconductor-layer lamination unit in which an A compound semiconductor layer and a B compound semiconductor layer are laminated, a compound semiconductor composition B configuring the B compound semiconductor layer is determined based on a difference between a base lattice constant of a base used at a time of forming the A and B compound semiconductor layers and a lattice constant of a compound semiconductor composition A configuring the A compound semiconductor layer, a thickness of the B compound semiconductor layer is determined based on a difference between the base lattice constant and a lattice constant of the compound semiconductor composition B, and on a thickness of the A compound semiconductor layer, the thickness of the A compound semiconductor layer is smaller than a critical film thickness of the compound semiconductor composition A, and is a thickness that causes no quantum effect, and the thicknesses of the B compound semiconductor layer is smaller than a critical film thickness of the compound semiconductor composition B, and is a thickness that causes no quantum effect.

In the predetermined sub-cell in the multi-junction solar cell of an embodiment of the present disclosure, or in the photoelectric conversion device: the first compound semiconductor layer and the second compound semiconductor layer are laminated; the first compound semiconductor layer is configured of at least one first-compound-semiconductor-layer lamination unit in which the 1-A compound semiconductor layer and the 1-B compound semiconductor layer are laminated; and the second compound semiconductor layer is configured of at least one second-compound-semiconductor-layer lamination unit in which the 2-A compound semiconductor layer and the 2-B compound semiconductor layer are laminated. Further, the compound semiconductor composition A that configures the 1-A compound semiconductor layer and the 2-A compound semiconductor layer is determined based on the value of a band gap of the predetermined sub-cell; the compound semiconductor composition B that configures the 1-B compound semiconductor layer and the 2-B compound semiconductor layer is determined based on the difference between the base lattice constant of the base used at the time of forming the first and second compound semiconductor layers and the lattice constant of the compound semiconductor composition A; and the thicknesses of the 1-B compound semiconductor layer and the 2-B compound semiconductor layer are determined based on the difference between the base lattice constant and the lattice constant of the compound semiconductor composition B, and on the thickness of the 1-A compound semiconductor layer and the thickness of the 2-A compound semiconductor layer. Moreover, the thicknesses of the 1-A compound semiconductor layer and the 2-A compound semiconductor layer are smaller than the critical film thickness of the compound semiconductor composition A, and are thicknesses that cause no quantum effect; and the thicknesses of the 1-B compound semiconductor layer and the 2-B compound semiconductor layer are smaller than the critical film thickness of the compound semiconductor composition B, and are thicknesses that cause no quantum effect. In such a manner, a distortion compensation structure is configured of the 1-A compound semiconductor layer and the 1-B compound semiconductor layer.

Further, when a desirable band gap of the predetermined sub-cell, in other words, for example, a wavelength of light which the predetermined sub-cell is allowed to absorb most efficiently is set, or when a desirable band gap of the photoelectric conversion device, in other words, a wavelength of light which the photoelectric conversion device is allowed to absorb most efficiently or a desirable light emission wavelength is set, the compound semiconductor composition A that achieves this is determined. However, usually, the lattice constant of the determined compound semiconductor composition A and the base lattice constant have a difference, in other words, often, lattice-unmatched type is established. Therefore, in order to eliminate this difference, in other words, in order to cancel this difference (in order to establish a lattice-matched type), the compound semiconductor composition B is determined. Moreover, based on the difference between the base lattice constant and the lattice constant of the compound semiconductor composition B, and on the thicknesses of the 1-A compound semiconductor layer and the 2-A compound semiconductor layer, not only the thicknesses of the 1-B compound semiconductor layer and the 2-B compound semiconductor layer are determined, but also, upper-limit values and lower-limit values of layer thicknesses of the 1-A and 2-A compound semiconductor layers and the 1-B and 2-B compound semiconductor layers are defined. In other words, when these layer thicknesses are over the upper-limit values, lattice mismatch is caused, and dislocation may be caused. Further, when these layer thicknesses are smaller than the lower-limit values, the value of the band gap is varied.

In such a manner, in each of the first compound semiconductor layer and the second compound semiconductor layer in the predetermined sub-cell, the compound semiconductor composition is optimized (in other words, the band gap and the lattice constant are optimized), and the layer thickness is optimized. As a result of the above, even when lattice mismatch is established between the 1-A compound semiconductor layer and the base, this lattice mismatch is cancelled by the 1-B compound semiconductor layer, and the first compound semiconductor layer as a whole becomes of a lattice-matched type. The same is applicable also to the second compound semiconductor layer as a whole. Moreover, the first compound semiconductor layer and the second compound semiconductor layer as a whole are allowed to achieve efficient absorption with a desirable wavelength of light or light emission with a desirable wavelength. Further, this may, for example, further improve efficiency in absorption of solar light having a wide wavelength range, in the multi-junction solar cell.

In the compound-semiconductor-layer lamination structure according to an embodiment of the present disclosure: the compound semiconductor composition B is determined based on the difference between the base lattice constant and the lattice constant of the compound semiconductor composition A; and the thickness of the B compound semiconductor layer is determined based on the difference between the base lattice constant and the lattice constant of the compound semiconductor composition B, and on the thickness of the A compound semiconductor layer. Therefore, even when lattice mismatch is established between the A compound semiconductor layer and the base, this lattice mismatch is cancelled by the B compound semiconductor layer, and the compound-semiconductor-layer lamination structure as a whole becomes of a lattice-matched type. Therefore, restriction such as that it is necessary to determine the compound semiconductor composition A being limited by the base lattice constant in order to obtain the lattice-matched type is eased. Therefore, it is possible to expand the range of options for the compound semiconductor composition of the compound semiconductor layer configuring the compound-semiconductor-layer lamination structure, and to improve freedom in options.

Additional features and advantages are described herein, and will be apparent from the following Detailed Description and the figures.

BRIEF DESCRIPTION OF THE FIGURES

FIG. 1 (A) and (B) of FIG. 1 are a conceptual diagram of a multi-junction solar cell, and a conceptual diagram of a predetermined sub-cell located in a lowermost layer, a photoelectric conversion device, and a compound-semiconductor-layer lamination structure, respectively, in Example 1 or Example 3.

FIG. 2 (A) and (B) of FIG. 2 are conceptual diagrams of a compound semiconductor layer and the like for explaining a method of manufacturing the multi-junction solar cell, the photoelectric conversion device, and the compound-semiconductor-layer lamination structure in Example 3.

FIG. 3 (A) and (B) of FIG. 3 are conceptual diagrams of the compound semiconductor layer and the like for explaining the method of manufacturing the multi-junction solar cell, the photoelectric conversion device, and the compound-semiconductor-layer lamination structure in Example 3, following (B) of FIG. 2.

FIG. 4 (A) and (B) of FIG. 4 are conceptual diagrams of multi-junction solar cells, photoelectric conversion devices, and compound-semiconductor-layer lamination structures in Example 4 and Example 5, respectively.

FIG. 5 (A) and (B) of FIG. 5 are conceptual diagrams of a compound semiconductor layer and the like for explaining a method of manufacturing a multi-junction solar cell, a photoelectric conversion device, and a compound-semiconductor-layer lamination structure in Example 6.

FIG. 6 (A) and (B) of FIG. 6 are conceptual diagrams of the compound semiconductor layer and the like for explaining the method of manufacturing the multi-junction solar cell, the photoelectric conversion device, and the compound-semiconductor-layer lamination structure in Example 6, following (B) of FIG. 5.

FIG. 7 is a conceptual diagram of the compound semiconductor layer and the like for explaining the method of manufacturing the multi-junction solar cell, the photoelectric conversion device, and the compound-semiconductor-layer lamination structure in Example 6, following (B) of FIG. 6.

FIG. 8 (A) and (B) of FIG. 8 are conceptual diagrams of a compound semiconductor layer and the like for explaining a method of manufacturing a multi-junction solar cell, a photoelectric conversion device, and a compound-semiconductor-layer lamination structure in Example 7.

FIG. 9 (A) and (B) of FIG. 9 are conceptual diagrams of the compound semiconductor layer and the like for explaining the method of manufacturing the multi-junction solar cell, the photoelectric conversion device, and the compound-semiconductor-layer lamination structure in Example 7, following (B) of FIG. 8.

FIG. 10 (A) and (B) of FIG. 10 are conceptual diagrams of the compound semiconductor layer and the like for explaining the method of manufacturing the multi-junction solar cell, the photoelectric conversion device, and the compound-semiconductor-layer lamination structure in Example 7, following (B) of FIG. 9.

FIG. 11 is a conceptual diagram of a modification of the multi-junction solar cell in Example 1.

FIG. 12 is a graph showing results obtained by variously varying band gaps of a second sub-cell and a first sub-cell, simulating, and determining conversion efficiencies, when a band gap of a fourth sub-cell is 1.910 eV and a band gap of a third sub-cell is 1.420 eV in a multi-junction solar cell in which four sub-cells are laminated.

FIG. 13 is a characteristic diagram illustrating film-forming characteristics of metal atoms.

FIG. 14 is a characteristic diagram illustrating a relationship between a film thickness of a Ti layer and light transmittance.

FIG. 15 (A) and (B) of FIG. 15 are photographs showing a result of an infrared microscopic transmission experiment.

FIG. 16 is a graph showing a relationship between photon energy and an absorption coefficient for each concentration of a p-type dopant in a p-type GaAs layer.

FIG. 17 is a graph showing a relationship between a thickness of the p-type GaAs layer at p-type dopant concentration of $3 \times 10^{19}$ and transmittance of solar light at maximum wavelength of 2.5 μm.

FIG. 18 is a photograph of a bright-field image, of an interface of a junction of an InP substrate and a GaAs substrate, obtained by a scanning transmission electron microscope.

FIG. 19 is a graph showing variation in the film thickness of the Ti layer and the light transmittance over time.

FIG. 20 is a graph showing variation in the film thickness of the Ti layer and the light transmittance over time.

FIG. 21 is a graph showing a result of quantitative analysis of concentration of each atom in each distance in a lamination direction of the multi-junction solar cell in Example 3 based on energy dispersive X-ray spectrometry.

FIG. 22 is a photograph of a cross-section of a bonding junction interface obtained by a transmission electron microscope.

DETAILED DESCRIPTION

The present disclosure will be described below based on Examples referring to the drawings. However, the present disclosure is not limited to the Examples, and various numerical values, materials, etc. in the Examples are examples. It is to be noted that the description will be given in the following order.
1. Description related to general matters of a multi-junction solar cell, a photoelectric conversion device, and a compound-semiconductor-layer lamination structure of the present disclosure
2. Example 1 (the multi-junction solar cell, the photoelectric conversion device, and the compound-semiconductor-layer lamination structure of the present disclosure)
3. Example 2 (a modification of Example 1)
4. Example 3 (another modification of Example 1)
5. Example 4 (a modification of Example 3)
6. Example 5 (another modification of Example 3)
7. Example 6 (still another modification of Example 3)
8. Example 7 (a modification of Example 6) and others

[Description Related to General Matters of a Multi-junction Solar Cell, a Photoelectric Conversion Device, and a Compound-semiconductor-layer Lamination Structure of the Present Disclosure]

In a multi-junction solar cell of the present disclosure, a form may be adopted in which a predetermined sub-cell is located in a lowermost layer. A lamination order in a plurality of sub-cells is set to be a lamination order by which a band gap of a compound semiconductor configuring the sub-cell becomes larger as the compound semiconductor is closer to a light incident side, that is, a lamination order by which the band gaps of the compound semiconductors are larger in order from a support substrate side to a second electrode side which will be described later. In some cases, part of the plurality of sub-cells may be configured of a Ge layer.

In the multi-junction solar cell of the present disclosure including the above-described preferable form, or the photoelectric conversion device of the present disclosure or the compound-semiconductor-layer lamination structure of the present disclosure, a form may be adopted in which a group of atoms configuring the compound semiconductor composition A is same as a group of atoms configuring the compound semiconductor composition B. Further, in this case, a form may be adopted in which atomic percentage of the group of atoms configuring the compound semiconductor composition A is different from atomic percentage of the group of atoms configuring the compound semiconductor composition B.

Moreover, a value of the band gap of the predetermined sub-cell in the multi-junction solar cell of the present disclosure including the above-described various preferable forms, or a value of the band gap of the photoelectric conversion device in the photoelectric conversion device of the present disclosure including the above-described various preferable forms may be preferably from 0.45 eV to 0.75 eV both inclusive.

Further, in the multi-junction solar cell of the present disclosure including the above-described preferable forms and configurations, or in the photoelectric conversion device of the present disclosure or the compound-semiconductor-layer lamination structure of the present disclosure, a value of a band gap of the compound semiconductor composition B may be desirably larger than a value of a band gap of the compound semiconductor composition A.

Further, in the multi-junction solar cell or the photoelectric conversion device of the present disclosure including the above-described preferable forms and configurations, or in the compound-semiconductor-layer lamination structure of the present disclosure, $$|(LC_A - LC_0)/LC_0| \leq 1 \times 10^{-3} \text{ and}$$

$$0.25 \leq |(LC_B - LC_0)/(LC_A - LC_0)| \leq 4.0$$

may be preferably satisfied where $LC_A$ is the lattice constant of the compound semiconductor composition A, $LC_B$ is the lattice constant of the compound semiconductor composition B, and $LC_0$ is the base lattice constant. Further, in this case, $$LC_A - LC_0 > 0 \text{ and}$$

$$LC_B - LC_0 < 0$$

may be more preferably established.

Further, in the multi-junction solar cell or the photoelectric conversion device of the present disclosure including the above-described preferable forms and configurations, or in the compound-semiconductor-layer lamination structure of the present disclosure, $$-1 \times 10^{-3} \leq \{(t_B \cdot LC_B + t_A \cdot LC_A)/(t_B + t_A) - LC_0\}/LC_0 \leq 1 \times 10^{-3}$$

may be desirably satisfied where $LC_A$ is the lattice constant of the compound semiconductor composition A, $LC_B$ is the lattice constant of the compound semiconductor composition B, $LC_0$ is the base lattice constant, $t_A$ is the thickness of the 1-A compound semiconductor layer and the 2-A compound semiconductor layer (or the thickness of the A compound semiconductor layer), and $t_B$ is the thickness of the 1-B compound semiconductor layer and the 2-B compound semiconductor layer (or the thickness of the B compound semiconductor layer).

Further, in the multi-junction solar cell or the photoelectric conversion device of the present disclosure including the above-described various preferable forms and configurations, or in the compound-semiconductor-layer lamination structure of the present disclosure, a configuration may be adopted in which the base is formed of InP, the compound semiconductor composition A is $In_xGa_{1-31\ x}As$, and the compound semiconductor composition B is $In_yGa_{1-y}As$ (where x>y). Further, in this case, $$0.53 \leq x \leq 0.86 \text{ and}$$

$$0 \leq y \leq 0.53$$

may be more preferably established. Alternatively, a configuration may be adopted in which the base is formed of InP, the compound semiconductor composition A is $(InP)_{1-z}(In_xGa_{1-x}As)_z$, and the compound semiconductor composition B is $(InP)_{1-z}(In_yGa_{1-y}As)_z$ (where x'>y'). Further, in this case, $$0.53 \leq x' \leq 0.86,$$

$$0 \leq y' \leq 0.53, \text{ and}$$

$$0 < z < 1.0$$

may be more preferably established.

In the multi-junction solar cell or the photoelectric conversion device of the present disclosure including the above-described various preferable forms and configurations, or in the compound-semiconductor-layer lamination structure of the present disclosure (hereinafter, they may be collectively and simply referred to as "present disclosure" in some cases), the thicknesses of the 1-A compound semiconductor layer and the 2-A compound semiconductor layer are smaller than a critical film thickness of the compound semiconductor composition A, the thicknesses of the 1-B compound semiconductor layer and the 2-B compound semiconductor layer are smaller than a critical film thickness of the compound semiconductor composition B, the thickness of the A compound semiconductor layer is smaller than a critical film thickness of the compound semiconductor composition A, and the thicknesses of the B compound semiconductor layer is smaller than a critical film thickness of the compound semiconductor composition B. Here, when the thickness of the compound semiconductor layer is smaller than the critical film thickness, lattice mismatch is reduced due to distortion of crystalline lattice of the compound semiconductor crystal configuring the compound semiconductor layer, and thereby, occurrence of dislocation is suppressed. Further, the thicknesses of the 1-A compound semiconductor layer and the 2-A compound semiconductor layer are thicknesses that cause no quantum effect, the thicknesses of the 1-B compound semiconductor layer and the 2-B compound semiconductor layer are thicknesses that cause no quantum effect, the thickness of the A compound semiconductor layer is a thickness that causes no quantum effect, and the thickness of the B compound semiconductor layer is a thickness that causes no quantum effect. Here, "cause no quantum effect" means that quantum level is not generated even when surrounded by a double hetero barrier when the film thickness is equal to or larger than the de Broglie wave (from several nanometers to 20 nm both inclusive).

When the plurality of sub-cells are laminated in the multi-junction solar cell of the present disclosure, the lattice-mismatch type may be established between the sub-cells in some cases depending on the lattice constants of the compound semiconductors of the compound semiconductor layers configuring the sub-cells. In such a case, the sub-cell and the sub-cell that are to be the lattice-mismatched type may be desirably connected (joined) with the use of an amorphous connection layer formed of an electrically-conductive material. Alternatively, also in a case where the photoelectric conversion device of the present disclosure and a photoelectric conversion device other than that of the present disclosure are laminated, the lattice-mismatched type may be established in some cases depending on lattice constants of the compound semiconductors configuring the adjacent compound semiconductor layers between the laminated photoelectric conversion devices. In such a case, the compound semiconductor layer and the compound semiconductor layer that are to be the lattice-mismatched type may be desirably connected (joined) with the use of an amorphous connection layer formed of an electrically-conductive material. By connecting (joining) with the use of the amorphous connection layer formed of the electrically-conductive material in such a manner, contact resistance of a junction interface of the sub-cells or the compound semiconductor layers is reduced, and energy conversion efficiency is improved. It is to be noted that, in the description below, the multi-junction solar cell or the laminated photoelectric conversion devices provided with such a connection layer may be collectively referred to as "multi-junction solar cell of the present disclosure and the like provided with a connection layer" in some cases.

In the multi-junction solar cell of the present disclosure and the like provided with the connection layer in such a manner, depending on the lattice constants of the compound semiconductors that configure adjacent sub-cells or adjacent compound semiconductor layers, the adjacent sub-cells or the adjacent compound semiconductor layers may be of a lattice-matched type or a lattice-mismatched type. However, in the multi-junction solar cell of the present disclosure and the like provided with the connection layer as a whole, these lattice-matched type/lattice-mismatched type exist in a mixed manner. In the multi-junction solar cell of the present disclosure and the like provided with the connection layer, where a lattice constant of a compound semiconductor that configures one sub-cell or one compound semiconductor layer that is adjacent to the connection layer is $Lc_1$, and a lattice constant of a compound semiconductor that configures the other sub-cell or the other compound semiconductor layer that is adjacent to the connection layer is $Lc_2$, being the lattice-mismatched type means, being a type that satisfies:

$(Lc_1-Lc_2)/Lc_1 \geq 1\times10^{-3}$ (A)

or $(Lc_1-Lc_2)/Lc_1 \leq -1\times10^{-3}$ (B).

It is to be noted that, when a value of $(Lc_1-Lc_2)/Lc_1$ is out of the above-described range, that is, when the value satisfies:

$-1\times10^{-3} < (Lc_1-Lc_2)/Lc_1 < 1\times10^{-3}$ (C), it is the lattice-matched type. Further, in the multi-junction solar cell of the present disclosure and the like provided with the connection layer including such a preferable form, it may be preferable to adopt a form in which a tunnel junction layer is provided in a place between the adjacent sub-cells in which the connection layer is not provided. The same is applicable to, or the same may be adopted in the multi-junction solar cell and the photoelectric conversion device of the present disclosure including the above-described various preferable forms and configurations.

Here, as described above, the connection layer is a layer having amorphous characteristics, and is configured of metal or alloy. Specifically, as a material configuring the connection layer, it may be preferable to use a material having ohmic characteristics with respect to the compound semiconductor layer to be connected, more specifically, metal or alloy having a work function that is smaller than a Fermi level of an n-type semiconductor or is larger than a Fermi level of a p-type semiconductor. Accordingly, contact resistance is significantly reduced, and favorable ohmic connection is achievable. It is to be noted that "amorphous connection layer" or "connection layer having amorphous characteristics" means a state that does not have long-term orderly characteristics as in crystal and that does not allow a lattice image to be observed in an image taken by a transmission electron microscope as shown in FIG. 22.

A metal thin film (having a thickness of several nanometers or smaller, for example) is typically formed based on a PVD method such as a vacuum evaporation method and a sputtering method. However, at that time, the metal thin film is often formed in an island-like shape and is rarely formed in a layer-like shape. Further, when the metal thin film is formed in an island-like shape, it is difficult to control the film thickness with high accuracy. In formation of a metal thin film based on the vacuum evaporation method, often, an island is formed after atoms and molecules absorbed on a base have undergone processes such as surface diffusion, collision and aggregation, and desorption, and the island grows to be combined with an adjacent island, thereby forming a continuous thin film. At that time, formation of an island, transition from being amorphous to being a crystal layer, variation in crystal alignment, etc. occur.

Moreover, when evaporation is performed in a case where the thickness of the metal thin film is set to about that of a monoatomic layer, it is considered that whether metal atoms have a two-dimensional layer structure or a three-dimensional island structure depends on interaction of binding energy between metal atoms in an uppermost face and metal atoms existing therebelow, and binding energy between the metal atoms and the base. When the metal atoms are more stable to be combined to the metal atoms, the metal atoms have the three-dimensional island structure. On the other hand, when the metal atoms are more stable to be combined with the base, the metal atoms have the two-dimensional layer structure. FIG. 13 illustrates analogized characteristics of binding energy between metal atoms and metal atoms for the respective metal atoms [binding energy between adatoms] and analogized characteristics of binding energy between metal atoms and the base (here, GaAs or InP) [binding energy between adatom and substrate]. Metal atoms in Group (A) and Group (B) located in an upper region of a dashed line in FIG. 13 have high binding energy with respect to the base, and therefore, it is considered that the metal atoms are allowed to have the two-dimensional layer structure. Accordingly, as the material of the connection layer, it may be preferable to use the metal atoms belonging to Group (A) or Group (B).

Therefore, it may be preferable to adopt a form in which the connection layer made of an electrically-conductive material, more specifically, the connection layer configured of metal or alloy includes at least one type of atom (metal atom) selected from a group consisting of titanium (Ti), aluminum (Al), zirconium (Zr), hafnium (Hf), tungsten (W), tantalum (Ta), molybdenum (Mo), niobium (Nb), and vanadium (V). It is to be noted that, also when atom such as iron (Fe), chromium (Cr), nickel (Ni), and aluminum (Al) is further included in the connection layer, the characteristics thereof is not influenced at all. Alternatively, it may be preferable to adopt a form in which the connection layer is configured of a material selected from a group consisting of aluminum-oxide-doped zinc oxide [AZO], indium-zinc composite oxide [IZO], gallium-doped zinc oxide [GZO], indium-gallium composite oxide [IGO], In—GaZnO$_4$ [IGZO], and indium-tin composite oxide [ITO], that is, a material that is transparent and has electric conductivity. Alternatively, it is possible to adopt a form in which the connection layer is made of an amorphous compound semiconductor, specifically, portion (to be noted, this is amorphous) of a compound semiconductor layer in an interface of a compound semiconductor layer and a compound semiconductor layer. In such a form, the issue of lattice mismatch is avoidable by providing the portion of the amorphous compound semiconductor layer in between, and occurrence of faults such as dislocation is avoidable. It is to be noted that the connection layer may be configured, for example, of the above-described metal atoms, and thereby, contact resistance is sufficiently reduced, specifically, the contact resistance is allowed to satisfy $\rho_c \leq 1 \times 10^{-3}$ $\Omega \cdot cm^2$. More specifically, for example, when the connection layer is configured of titanium (Ti), for example, contact resistance $\rho_c$ with respect to a p$^+$-GaAs layer and an n$^+$-InP layer, or with respect to a p$^+$-GaAs layer and an n$^+$-InGaAsP layer is allowed to be $1 \times 10^{-3}$ $\Omega \cdot cm^2$ or smaller.

In the multi-junction solar cell of the present disclosure and the like provided with the connection layer including the above-described preferable forms and configurations, the thickness of the amorphous connection layer configured of the above-described metal or alloy may be desirably 5 nm or smaller, and may be preferably 2 nm or smaller. FIG. 14 shows a result of measuring a relationship between the thickness of the Ti layer and transmission characteristics of light having wavelengths within a range from 450 nm to 800 nm both inclusive, for example, and it can be seen therefrom that light transmittance of about 80% is secured when the thickness is 5 nm or smaller. Further, by allowing the thickness to be preferably 2 nm or smaller, light transmittance of 95% or higher is secured. On the other hand, the thickness of the amorphous connection layer configured of the above-described materials that is transparent and has electric conductivity, or the thickness of the amorphous connection layer configured of an amorphous compound semiconductor may be desirably $1 \times 10^{-7}$ m or smaller.

When the connection layer is configured of the above-described metal atom, in two sub-cells that face each other with the connection layer in between (one sub-cell is referred to as "sub-cell A" for the sake of convenience, and the other sub-cell is referred to as "sub-cell B" for the sake of convenience), it may be preferable that a first connection layer is provided in the sub-cell A, a second connection layer is provided in the sub-cell B, the first connection layer is joined to the second connection layer to be integrated, and thereby the sub-cell A is joined to the sub-cell B. In this case, the metal atom configuring the sub-cell A and the metal atom configuring the sub-cell B may be the same, or may be different. A thickness of the first connection layer and a thickness of the second connection layer may be the same, or may be different. It is to be noted that, for example, also when metal or alloy having a work function that is larger than the Fermi level of the n-type semiconductor or is smaller than the Fermi level of the p-type semiconductor is used, if the connection layer is configured, for example, of the first connection layer and the second connection layer having the same thickness, a width of each depletion layer is ½ of that of the pn junction. Accordingly, probability of causing a tunneling effect is increased. Therefore, it is an advantageous structure in terms of reduction in contact resistance. It may be desirable to perform plasma treatment on a junction face of the first connection layer and a junction face of the second connection layer before joining the first connection layer to the second connection layer, and thereby, to activate the junction face of the first connection layer and the junction face of the second connection layer. In other words, a dangling bond may be desirably formed in the junction interface. Also, by performing the plasma treatment, the first connection layer and the second connection layer are allowed to be amorphous. The junction of the first connection layer and the second connection layer is allowed to be performed at an ambient pressure of $5 \times 10^{-4}$ Pa or lower, with a junction load of $2 \times 10^4$ N or less, and at a temperature of 150° C. or lower. It may be desirable to perform the plasma treatment and the junction of the first connection layer and the second connection layer without breaking a vacuum in terms of prevention of oxidation of the junction face of the first connection layer and the junction face of the second connection layer.

Moreover, in the multi-junction solar cell of the present disclosure including the above-described preferable forms and configurations, it may be preferable to adopt a form in which conductivity types of the compound semiconductor layers that face each other in the sub-cells adjacent to each other are different. In particular, where the sub-cells adjacent to each other are "sub-cell a" and "sub-cell b", a compound semiconductor layer, in the sub-cell a, that faces the sub-cell b is "compound semiconductor layer a", and a compound semiconductor layer, in the sub-cell b, that faces the sub-cell a is "compound semiconductor layer b", it may be preferable to adopt a form in which a conductivity type of the compound semiconductor layer a is different from a conductivity type of the compound semiconductor layer b. Alternatively, it may be preferable to adopt a form in which conductivity types of the compound semiconductor layers that face each other with the connection layer in between are different. The same is applicable also to the photoelectric conversion device of the present disclosure including the above-described various preferable forms and configurations.

Moreover, in the multi-junction solar cell of the present disclosure including the above-described preferable forms and configurations, it may be desirable to adopt a form in which a thickness of a compound semiconductor layer having the conductivity type of the p-type out of the compound semiconductor layers configuring the sub-cells, more specifically, a thickness of the p$^+$-GaAs layer is 100 nm or smaller. The same is applicable also to the photoelectric conversion device of the present disclosure including the above-described various preferable forms and configurations.

Moreover, in the multi-junction solar cell of the present disclosure including the above-described preferable forms and configurations, as the compound semiconductor that configures a sub-cell other than the predetermined sub-cell, or as the compound semiconductor layer that configures other photoelectric conversion device in the laminated photoelectric conversion devices, an InGaAs layer, an InGaAsP layer, a GaAs layer, an InGaP layer, an AlInGaP layer, a GaAsN layer, an InGaAsN layer, an InP layer, an InAlAs layer, an InAlAsSb layer, an InGaAlAs layer, and an AlGaAs layer can be mentioned.

More specifically, when the multi-junction solar cell of the present disclosure including the above-described preferable forms and configurations is configured of two sub-cells, the respective sub-cells may be configured, for example, of the followings.

(InGaAsP layer, InGaAs layer)
(InGaAs layer, InGaAs layer)
(InP layer, InGaAs layer)

It is to be noted that light enters from the sub-cell having a layer configuration described on the most-left side in ( ). Further, when three sub-cells are used, the respective sub-cells may be configured, for example, of the followings.

(GaAs layer, InGaAsP layer, InGaAs layer)
(InGaAs layer, InGaAsP layer, InGaAs layer)
(InGaP layer, InGaAs layer, InGaAs layer)

Further, when four sub-cells are used, the respective sub-cells may be configured, for example, of the followings.

(GaInP layer, GaAs layer, InGaAsP layer, InGaAs layer)
(GaInP layer, InGaAs layer, InGaAsP layer, InGaAs layer)
(GaInP layer, InGaAs layer, InGaAsN layer, InGaAs layer)

Further, when five sub-cells are used, the respective sub-cells may be configured, for example, of the followings.

(GaInP layer, GaAs layer, InGaAs layer, InGaAsP layer, InGaAs layer)
(GaInP layer, GaAs layer, InGaAsN layer, InGaAsP layer, InGaAs layer)
(GaInP layer, GaAs layer, InGaAs layer, InGaAs layer, InGaAs layer)

Further, when six sub-cells are used, the respective sub-cells may be configured, for example, of the following.

(AlGaInP, GaInP, AlGaInAs, GaAs, InGaAs, InGaAs)

It is to be noted that, when a plurality of sub-cells are described to be configured of the same compound semiconductor in one multi-junction solar cell, composition ratios thereof are different.

The multi-junction solar cell, the photoelectric conversion device, or the compound-semiconductor-layer lamination structure of the present disclosure including the above-described preferable forms and configurations is provided on a substrate. A substrate for film formation that is used at the time of manufacturing the multi-junction solar cell, the photoelectric conversion device, or the compound-semiconductor-layer lamination structure of the present disclosure and a support substrate may be the same substrate, or may be different substrates. It is to be noted that a substrate (corresponding to the base) in a case where the substrate for film formation is the same as the support substrate is expressed as "substrate for film-formation/support" for the sake of convenience. Alternatively, when the substrate for film formation is different from the support substrate, the respective substrates are expressed as "substrate for film formation" and "support substrate". In this case, after the compound semiconductor layers and the like are formed on the substrate for film formation (corresponding to the base), the substrate for film formation may be removed from the compound semiconductor layers and the like, and the compound semiconductor layers and the like may be fixed to the support substrate, or may be bonded to the support substrate. As a method of removing the substrate for film formation from the compound semiconductor layers and the like, a laser ablation method, a heating method, an etching method, etc. can be mentioned. Further, as a method of fixing or bonding the compound semiconductor layers and the like to the support substrate, a metal junction method, a semiconductor junction method, and a metal-semiconductor junction method may be mentioned other than a method using a bonding agent.

As described above, the substrate for film-formation/support may be preferably formed of InP. In other words, the substrate for film-formation/support may be preferably configured of an InP substrate. Further, as described above, the substrate for film formation used for manufacturing the predetermined sub-cell in the multi-junction solar cell of the present disclosure and the substrate for film formation used for manufacturing the photoelectric conversion device of the present disclosure may be preferably formed of InP. In other words, the substrate for film formation used for manufacturing the predetermined sub-cell in the multi-junction solar cell of the present disclosure and the substrate for film formation used for manufacturing the photoelectric conversion device of the present disclosure may be preferably configured of InP substrates.

On the other hand, as the substrate for film formation used for manufacturing the sub-cell other than the predetermined sub-cell in the multi-junction solar cell of the present disclosure, or the substrate for film formation used for manufacturing the other photoelectric conversion device in the photoelectric conversion device that has a lamination structure in which the photoelectric conversion device of the present disclosure and other photoelectric conversion device are laminated, a substrate made of a III-V group semiconductor or a II-VI group semiconductor can be mentioned. Specifically, as the substrate made of the III-V group semiconductor, GaAs, InP, GaN, AlN, etc. can be mentioned, and as the substrate made of the II-VI group semiconductor, CdS, CdTe, ZnSe, ZnS, etc. can be mentioned. Further, a substrate made of a I-III-VI group semiconductor called a chalcopyrite type made of Cu, In, Ga, Al, Se, S, etc. may be used, and specifically, $Cu(In,Ga)Se_2$ abbreviated as CIGS, $Cu(In,Ga)(Se,S)_2$ abbreviated as CIGSS, $CuInS_2$ abbreviated as CIS, etc. can be mentioned.

Moreover, as the support substrate, other than the above-described various substrates, a glass substrate, a quartz substrate, a transparent inorganic substrate such as a sapphire substrate, and a transparent plastic substrate or film made of a material such as: polyester resin such as polyethylene terephthalate (PET) and polyethylene naphthalate (PEN); polycarbonate (PC) resin; polyether sulfone (PES) resin; polyolefin resin such as polystyrene, polyethylene, and polypropylene; polyphenylene sulfide resin; polyvinylidene difluoride resin; tetraacetyl cellulose resin; phenoxy bromide resin; aramid resin; polyimide resin; polystyrene resin; polyarylate resin; polysulfone resin; acrylic resin; epoxy resin; fluororesin; silicone resin; diacetate resin; triacetate resin; polyvinyl chloride resin; and cyclic polyolefin resin can be mentioned. As the glass substrate, for example, a soda glass substrate, a heat-resistance glass substrate, and a quartz glass substrate can be mentioned.

A second electrode is formed on a sub-cell in an uppermost layer in the sub-cells configuring the multi-junction solar cell of the present disclosure. The second electrode may preferably have a thickness, for example, of about 10 nm to 100 nm both inclusive, and may be preferably configured of a material having favorable light transmission characteristics and having a small work function. As such a material, for example, indium-tine oxide (including ITO, Indium Tin Oxide, Sn-doped $In_2O_3$, crystalline ITO, and amorphous ITO), indium-zinc oxide (IZO, Indium Zinc Oxide), IFO (F-doped $In_2O_3$), tin oxide ($SnO_2$), ATO (Sbdoped $SnO_2$), FTO (F-doped $SnO_2$), zinc oxide (including ZnO, Al-doped ZnO, and B-doped ZnO), InSnZnO, spinel-type oxides, oxides having a $YbFe_2O_4$ structure, etc. can be mentioned. Further, alkaline-earth metal such as calcium (Ca) and barium (Ba), alkali metal such as lithium (Li) and cesium (Cs), indium (In), magnesium (Mg), silver (Ag), gold (Au), nickel (Ni), gold-germanium (Au—Ge), etc. can also be mentioned. Further, alkali-metal oxide such as $Li_2O$, $Cs_2Co_3$, $Cs_2SO_4$, MgF, LiF, and $CaF_2$, alkali-metal fluoride, alkaline-earth-metal oxide, and alkaline-earth fluoride can also be mentioned. The second electrode may have a single-layer configuration, or may have a configuration made by laminating a plurality of layers. The second electrode is allowed to be formed by a physical vapor deposition method (a PVD method) such as a vacuum evaporation method and a sputtering method, a chemical vapor deposition method (a CVD method), etc. The same is applicable also to the photoelectric conversion device of the present disclosure.

The first electrode is formed on the sub-cells, the compound semiconductor layers, etc. Alternatively, depending on materials configuring the substrate for film-formation/support or the support substrate, the substrate for film-formation/support or the support substrate itself may be used as the first electrode. As a material configuring the first electrode, molybdenum (Mo), tungsten (W), tantalum (Ta), vanadium (V), palladium (Pd), zinc (Zn), nickel (Ni), titanium (Ti), platinum (Pt), and gold-zinc (Au—Zn) can be mentioned as examples.

An anti-reflection film may be preferably formed on a portion, on the sub-cell in the uppermost layer (the sub-cell on the light incident side) in the sub-cells configuring the multi-junction solar cell of the present disclosure, on which the second electrode is not formed. The anti-reflection film is provided in order to suppress reflection in the sub-cell in the uppermost layer, and to take in solar light efficiently in the multi-junction solar cell of the present disclosure. As a material configuring the anti-reflection film, a material having a refractive index that is smaller than that of the compound semiconductor configuring the sub-cell in the uppermost layer may be preferably used. Specifically, for example, a layer made of $TiO_2$, $Al_2O_3$, ZnS, $MgF_2$, $Ta_2O_5$, $SiO_2$, or $Si_3N_4$, or a lamination structure of these layers can be mentioned. As a film thickness of the anti-reflection film, for example, from 10 nm to 200 nm both inclusive can be mentioned. The same is applicable also to the photoelectric conversion device of the present disclosure.

EXAMPLE 1

Example 1 relates to the multi-junction solar cell, the photoelectric conversion device, and the compound-semiconductor-layer lamination structure of the present disclosure. (A) of FIG. 1 shows a conceptual diagram of a multi-junction solar cell in Example 1. (B) of FIG. 1 shows a conceptual diagram of a predetermined sub-cell located in a lowermost layer, a photoelectric conversion device, and a compound-semiconductor-layer lamination structure.

The multi-junction solar cell in Example 1 shown in the conceptual diagram in (A) of FIG. 1 is a multi-junction solar cell in which a plurality of (four, in Example 1) sub-cells (a first sub-cell 11, a second sub-cell 12, a third sub-cell 13, and a fourth sub-cell 14) are laminated, light enters from the fourth sub-cell 14 located in an uppermost layer to the first sub-cell 11 located in the lowermost layer, and electric power is generated in each of the sub-cells 11, 12, 13, and 14. Each of the sub-cells 11, 12, 13, and 14 is configured of the first compound semiconductor layer having the first conductivity type and the second compound semiconductor layer having the second conductivity type that are laminated. It is to be noted that, in the description below, the first conductivity type is set as a p-type, and the second conductivity type is set as an n-type. Further, the base, the substrate for film-formation/support, and the substrate for film formation are each configured of a p-type InP substrate. However, the present disclosure is not limited thereto.

A lamination order in the plurality of sub-cells is set to be a lamination order by which a band gap of the compound semiconductor configuring the sub-cell becomes larger as the compound semiconductor is closer to the light incident side, that is, a lamination order by which the band gaps of the compound semiconductors are larger in order from a substrate for film-formation/support 31 side to a second electrode side. Specifically, on the substrate for film-formation/support 31, the first sub-cell 11, the second sub-cell 12, the third sub-cell 13, and the fourth sub-cell 14 are formed in this order, and for example, solar light may enter from the fourth sub-cell 14.

Further, the photoelectric conversion device in Example 1 is a photoelectric conversion device configured of a first compound semiconductor layer 11A having the first conductivity type and a second compound semiconductor layer 11C having the second conductivity type that are laminated.

It is to be noted that, hereinbelow, mostly, detailed description will be provided on at least one predetermined sub-cell (the sub-cell 11 located in the lowermost layer, in Example 1) out of the plurality of sub-cells. Detailed description will be provided on the remaining sub-cells 12, 13, and 14 from Example 3 and thereafter.

Further, in at least one predetermined sub-cell (the sub-cell 11 located in the lowermost layer, in Example 1) out of the plurality of sub-cells, or in the photoelectric conversion device in Example 1, the first compound semiconductor layer 11A is configured of at least one first-compound-semiconductor-layer lamination unit $11A_U$ in which a 1-A compound semiconductor layer $11A_A$ of a p-type and a 1-B compound semiconductor layer $11A_B$ of a p-type are laminated. Further, the second compound semiconductor layer 11C is configured of at least one second-compound-semiconductor-layer lamination unit $11C_U$ in which a 2-A compound semiconductor layer $11C_A$ of an n-type (more specifically, an $n^+$-type, in Example 1) and a 2-B compound semiconductor layer $11C_B$ of an n-type (more specifically, an $n^+$-type, in Example 1) are laminated. It is to be noted that, in (B) of FIG. 1, three first-compound-semiconductor-layer lamination units $11A_U$ and three second-compound-semiconductor-layer lamination units $11C_U$ are illustrated; however, this is not limitative. Moreover, a compound semiconductor composition configuring the 1-A compound semiconductor layer $11A_A$ and a compound semiconductor composition configuring the 2-A compound semiconductor layer $11C_A$ are the same compound semiconductor composition A. Further, a compound semiconductor composition configuring the 1-B compound semiconductor layer $11A_B$ and a compound semiconductor composition configuring the 2-B compound semiconductor layer $11C_B$ are the same compound semiconductor composition B. In other words, a group of atoms configuring the compound semiconductor composition A and a group of atoms configuring the compound semiconductor composition B are the same, and are specifically, InGaAs. However, as will be described later, atomic percentage of the group of atoms configuring the compound semiconductor composition A is different from atomic percentage of the group of atoms configuring the compound semiconductor composition B.

Band gaps of the second sub-cell and the first sub-cell were variously varied, simulation is performed, and conversion efficiency was determined when the AM 1.5 solar light was in a non-condensed state (1 sun), and the followings were set.

a band gap of the fourth sub-cell: 1.910 eV
a band gap of the third sub-cell: 1.420 eV Result thereof is shown in FIG. 12, which shows that a region in which the conversion efficiency is high is present in the following range.

the band gap of the first sub-cell: from 0.46 eV to 0.56 eV both inclusive
the band gap of the second sub-cell: from 1.01 eV to 1.04 eV both inclusive Moreover, as a result of the simulation, when
the band gap of the first sub-cell: 0.536 eV
the band gap of the second sub-cell: 1.020 eV
were established,
FF=87.6%
$V_{OC}$=3.358 volts
$V_{mp}$=3.020 volts
$J_{mp}$=13.807 milliamperes
were obtained, and 41.64% (non-condensed light) was obtained as maximum conversion efficiency. It is to be noted that, in FIG. 12, the conversion efficiency is increased from a region indicated by an arrow "A" to a region indicated by an arrow "C", the conversion efficiency is increased from a region indicated by an arrow "B" to the region indicated by the arrow "C", and the region indicated by the arrow "C" is a region with highest conversion efficiency.

Further, the compound semiconductor composition A is determined based on a value of a band gap of the predetermined sub-cell 11, or based on a value of a band gap of the photoelectric conversion device. Here, the value of the band gap of the predetermined sub-cell 11 or the value of the band gap of the photoelectric conversion device is from 0.45 eV to 0.75 eV both inclusive. However, in Example 1, more specifically, the value of the band gap of the predetermined sub-cell 11 or the value of the band gap of the photoelectric conversion device was set to 0.65 eV. A compound semiconductor layer that has such a desirable value of band gap favorably absorbs light with a wavelength of 1907.7 nm or less. Further, the compound semiconductor composition A that is the composition of the 1-A compound semiconductor layer that has such a value of band gap is $In_{0.63}Ga_{0.37}As$. It is to be noted that a critical film thickness of $In_{0.63}Ga_{0.37}As$ is 72 nm. Further, when the film thickness is 12 nm or smaller, quantum effect is remarkably caused.

Where $LC_A$ is the lattice constant of the compound semiconductor composition A, $LC_A$ is the lattice constant of the compound semiconductor composition B, and $LC_0$ is the base lattice constant, values of $LC_A$, $LC_B$, $LC_0$, and $(LC_A-LC_0)/LC_0$ are as shown in Table 1 below.

In Example 1, the compound semiconductor composition B is determined based on a difference between the base lattice constant $LC_0$ of the base (specifically, the p-type InP substrate) used at a time of forming the first compound semiconductor layer 11A and the second compound semiconductor layer 11C, and the lattice constant $LC_A$ of the compound semiconductor composition A. Specifically, as shown in Table 1, since $$(LC_A-LC_0)/LC_0=6.8\times10^{-3}$$

is established, the compound semiconductor composition B is determined so that a value of $(LC_B-LC_0)/LC_0$ which cancels this value of $(LC_A-LC_0)/LC_0$ is obtained. More specifically, the composition of the compound semiconductor composition B was set as $In_{0.45}Ga_{0.55}As$. It is to be noted that a value of $(LC_B-LC_0)/LC_0$ is as shown in Table 1 below. Further, a value of a band gap of the compound semiconductor composition B is larger than a value of a band gap of the compound semiconductor composition A.

As described above, $$|(LC_A-LC_0)/LC_0|\leq 1\times 10^{-3} \text{ and}$$

$$0.25\leq|(LC_B-LC_0)/(LC_A-LC_0)|\leq 4.0$$

are satisfied, and further, $$LC_A-LC_0>0 \text{ and}$$

$$LC_B-LC_0<0$$

are established.

Moreover, a thickness $t_B$ of the 1-B compound semiconductor layer is determined based on a difference between the base lattice constant $LC_0$ and a lattice constant $LC_B$ of the compound semiconductor composition B, and on a thickness $t_A$ of the 1-A compound semiconductor layer. Further, a thickness $t_B$ of the 2-B compound semiconductor layer is determined based on the difference between the base lattice constant $LC_0$ and the lattice constant $LC_B$ of the compound semiconductor composition B, and on a thickness $t_A$ of the 2-A compound semiconductor layer. The thickness $t_A$ of the 1-A compound semiconductor layer and the 2-A compound semiconductor layer and the thickness $t_B$ of the 1-B compound semiconductor layer and the 2-B compound semiconductor layer satisfy the following expression.

$$-1\times10^{-3}\leq\{(t_B\cdot LC_B+t_A\cdot LC_A)/(t_B+t_A)-LC_0\}/LC_0\leq 1\times 10^{-3}$$

Here, the thickness $t_A$ of the 1-A compound semiconductor layer and the 2-A compound semiconductor layer is smaller than a critical film thickness of the compound semiconductor composition A, and is a thickness that causes no quantum effect. Further, the thickness $t_B$ of the 1-B compound semiconductor layer and the 2-B compound semiconductor layer is smaller than a critical film thickness of the compound semiconductor composition B, and is a thickness that causes no quantum effect. It is to be noted that, in the compound semiconductor composition B, when the film thickness is 15 nm or smaller, quantum effect is remarkably caused.

The above-described various values are summarized in Table 1 and Table 2 below.

TABLE 1

$LC_A$ = 5.908 Å
$LC_B$ = 5.836 Å
$LC_0$ = 5.868 Å
$(LC_A - LC_0)/LC_0 = 6.8 \times 10^{-3}$
$(LC_B - LC_0)/LC_0 = -5.5 \times 10^{-3}$

TABLE 2

| Compound semiconductor composition A: | |
|---|---|
| Composition: | $In_{0.63}Ga_{0.37}As$ (x = 0.63) |
| Critical film thickness | 72 nm |
| Band gap: | 0.65 eV |
| Compound semiconductor composition B: | |
| Composition: | $In_{0.45}Ga_{0.55}As$ (y = 0.45) |
| Critical film thickness | 94.5 nm |
| Band gap: | 0.83 eV |
| Thickness $t_A$ of the 1-A compound semiconductor layer and the 2-A compound semiconductor layer: | 50 nm |

TABLE 2-continued

| | |
|---|---|
| Thickness $t_B$ of the 1-B compound semiconductor layer and the 2-B compound semiconductor layer: | 40 nm |

Here, a total thickness of the first compound semiconductor layers 11A having the conductivity type of a p-type was set as 3.0 μm. Therefore, the number of the first-compound-semiconductor-layer lamination units $11A_U$ in which the 1-A compound semiconductor layer $11A_A$ and the 1-B compound semiconductor layer $11A_B$ are laminated is 33. It is to be noted that, the first compound semiconductor layers 11A having the conductivity type of a p-type has a lamination structure that has a conductivity type of a p$^+$-type on an InP substrate side, and has a conductivity type of a p-type on a second compound semiconductor layer 11C side. A total thickness of the first compound semiconductor layers $11A_1$ having the conductivity type of a p$^+$-type was set as 0.1 μm, and a total thickness of the first compound semiconductor layers $11A_2$ having the conductivity type of a p-type was set as 2.9 μm. Further, a total thickness of the second compound semiconductor layers 11C having a conductivity type of an n$^+$-type was set as 0.2 μm. Therefore, the number of the second-compound-semiconductor-layer lamination units $11C_U$ in which the 2-A compound semiconductor layer $11C_A$ and the 2-B compound semiconductor layer $11C_B$ are laminated is from 2 to 3 both inclusive.

The thickness of the first compound semiconductor layer 11A is a product of (the number of the first-compound-semiconductor-layer lamination units $11A_U$) and $(t_A+t_B)$. It may be desirable to allow a value of $(t_A+t_B)$ to be as large as possible, and to allow a value of (the number of the first-compound-semiconductor-layer lamination units $11A_U$) to be as small as possible, for example, in terms of reduction in the number of energy gaps formed in the first compound semiconductor layer 11A. Various tests may be performed on the multi-junction solar cell or the photoelectric conversion device, and the values of (the number of the first-compound-semiconductor-layer lamination units $11A_U$) and $(t_A+t_B)$ may be determined based thereon. The same is applicable also to values of (the number of the second-compound-semiconductor-layer lamination units $11C_U$) and $(t_A+t_B)$. Also, the same is applicable to the Examples below as well.

The compound-semiconductor-layer lamination structure in Example 1 is a compound-semiconductor-layer lamination structure that includes at least one compound-semiconductor-layer lamination unit in which the A compound semiconductor layer $11A_A$ and a B compound semiconductor layer $11A_B$ are laminated, wherein the compound semiconductor composition B configuring the B compound semiconductor layer $11A_B$ is determined based on a difference between the base lattice constant $LC_0$ of the base (specifically, InP) used at a time of forming the A compound semiconductor layer $11A_A$ and the B compound semiconductor layer $11A_B$ and the lattice constant $LC_A$ of the compound semiconductor composition A configuring the A compound semiconductor layer $11A_A$, a thickness of the B compound semiconductor layer $11A_B$ is determined based on a difference between the base lattice constant $LC_0$ and the lattice constant $LC_B$ of the compound semiconductor composition B, the thickness of the A compound semiconductor layer $11A_A$ is smaller than the critical film thickness of the compound semiconductor composition A, and is a thickness that causes no quantum effect, and the thickness of the B compound semiconductor layer $11A_B$ is smaller than the critical film thickness of the compound semiconductor composition B, and is a thickness that causes no quantum effect.

As described above, the sub-cell 11 that configures the lowermost layer in the multi-junction solar cell in Example 1 favorably absorbs light with a wavelength of 1907.7 nm or less. Further, the sub-cell 11 as a whole is lattice-matched with the InP substrate which is the base.

In the multi-junction solar cell in Example 1, when a band gap of the predetermined sub-cell 11, in other words, for example, a wavelength of light which the predetermined sub-cell 11 is allowed to absorb most efficiently is set, or when a band gap of the photoelectric conversion device, in other words, a wavelength of light which the photoelectric conversion device is allowed to absorb most efficiently or a desirable light emission wavelength is set, the compound semiconductor composition A that achieves this is determined. However, usually, the lattice constant $LC_A$ of the determined compound semiconductor composition A and the base lattice constant $LC_0$ have a difference, in other words, often, lattice-unmatched type is established. Therefore, in order to eliminate this difference, in other words, in order to cancel this difference (in order to establish a lattice-matched type), the compound semiconductor composition B is determined. Moreover, based on the difference between the base lattice constant $LC_0$ and the lattice constant $LC_B$ of the compound semiconductor composition B, and on the thickness $t_A$ of the 1-A compound semiconductor layer and the 2-A compound semiconductor layer, not only the thickness $t_B$ of the 1-B compound semiconductor layer and the 2-B compound semiconductor layer is determined, but also, upper-limit values and lower-limit values of layer thicknesses $t_A$ and $t_B$ of the 1-A and 2-A compound semiconductor layers and the 1-B and 2-B compound semiconductor layers are defined.

In such a manner, in each of the first compound semiconductor layer and the second compound semiconductor layer, the compound semiconductor composition is optimized (in other words, the band gap and the lattice constant are optimized), and the layer thickness is optimized. As a result, even when lattice mismatch is established between the 1-A compound semiconductor layer and the base, this lattice mismatch is cancelled by the 1-B compound semiconductor layer, and the first compound semiconductor layer as a whole becomes of a lattice-matched type. In other words, the 1-A compound semiconductor layer and the 1-B compound semiconductor layer configure a distortion compensation lamination structure. The same is applicable also to the second compound semiconductor layer as a whole. Moreover, the first compound semiconductor layer and the second compound semiconductor layer as a whole are allowed to achieve efficient absorption with a desirable wavelength of light or light emission with a desirable wavelength. Further, this may, for example, further improve efficiency in absorption of solar light having a wide wavelength range in the multi-junction solar cell.

Moreover, in the compound-semiconductor-layer lamination structure in Example 1 the compound semiconductor composition B is determined based on the difference between the base lattice constant $LC_o$ and the lattice constant $LC_A$ of the compound semiconductor composition A, and the thickness of the B compound semiconductor layer $11A_B$ is determined based on the difference between the base lattice constant $LC_0$ and the lattice constant $LC_B$ of the compound semiconductor composition B and on the thickness $t_A$ of the A compound semiconductor layer $11A_A$. Therefore, even when lattice mismatch is established between the A compound semiconductor layer $11A_A$ and the base, this lattice mismatch is cancelled by the B compound semiconductor layer $11A_B$, and the compound-semiconductor-layer lamination structure as a whole becomes of a lattice-matched type. Therefore, restriction such as that it is necessary to determine the compound semiconductor composition A being limited by the base lattice constant in order to obtain the lattice-matched type is eased. Therefore, it is possible to expand the range of options for the compound semiconductor composition of the compound semiconductor layer configuring the compound-semiconductor-layer lamination structure, and to improve freedom in options.

EXAMPLE 2

Example 2 is a modification of Example 1. In Example 2, the value of the band gap of the predetermined sub-cell 11, or the value of the band gap of the photoelectric conversion device was set as 0.55 eV. A compound semiconductor layer that has such a value of band gap favorably absorbs light with a wavelength of 2254.5 nm or less. Further, the compound semiconductor composition A that is a composition of the 1-A compound semiconductor layer that has such a value of band gap is $In_{0.74}Ga_{0.26}As$. It is to be noted that a critical film thickness of $In_{0.74}Ga_{0.26}As$ is 55.5 nm. Further, when the film thickness is 12 nm or smaller, quantum effect is remarkably caused.

Moreover, where $LC_A$ is the lattice constant of the compound semiconductor composition A, $LC_A$ is the lattice constant of the compound semiconductor composition B, and $LC_0$ is the base lattice constant, values of $LC_A$, $LC_B$, $LC_0$, and $(LC_A-LC_0)/LC_0$ are as shown in Table 3 below. Also, the composition of the compound semiconductor composition A, the composition of the compound semiconductor composition B, the thickness $t_o$ of the 1-A compound semiconductor layer and the 2-A compound semiconductor layer, and the thickness $t_B$ of the 1-B compound semiconductor layer and the 2-B compound semiconductor layer are shown in Table 4. It is to be noted that, in the compound semiconductor composition B, when the film thickness is 15 nm or smaller, quantum effect is remarkably caused.

TABLE 3

| | |
|---|---|
| $LC_A$ = 5.953 Å | |
| $LC_B$ = 5.783 Å | |
| $LC_0$ = 5.868 Å | |
| $(LC_A - LC_0)/LC_0 = 1.4 \times 10^{-2}$ | |
| $(LC_B - LC_0)/LC_0 = -1.4 \times 10^{-2}$ | |

TABLE 4

| Compound semiconductor composition A: | |
|---|---|
| Composition: | $In_{0.74}Ga_{0.26}As$ (x = 0.74) |
| Critical film thickness | 28.5 nm |
| Band gap: | 0.55 eV |
| Compound semiconductor composition B: | |
| Composition: | $In_{0.32}Ga_{0.68}As$ (y = 0.32) |
| Critical film thickness | 27.5 nm |
| Band gap: | 0.98 eV |
| Thickness $t_A$ of the 1-A compound semiconductor layer and the 2-A compound semiconductor layer: | 24 nm |
| Thickness $t_B$ of the 1-B compound semiconductor layer and the 2-B compound semiconductor layer: | 24 nm |

Here, the total thickness of the first compound semiconductor layers 11A having the conductivity type of a p-type was set as 3.0 μm. Therefore, the number of the first-compound-semiconductor-layer lamination units $11A_U$ in which the 1-A compound semiconductor layer $11A_A$ and the 1-B compound semiconductor layer $11A_B$ are laminated is 63. It is to be noted that, the first compound semiconductor layers 11A having the conductivity type of a p-type has a lamination structure that has a conductivity type of a $p^+$-type on an InP substrate side, and has a conductivity type of a p-type on a second compound semiconductor layer 11C side. The total thickness of the first compound semiconductor layers $11A_1$ having the conductivity type of a $p^+$-type was set as 0.1 μm, and the total thickness of the first compound semiconductor layers $11A_2$ having the conductivity type of a p-type was set as 2.9 μm. Further, the total thickness of the second compound semiconductor layers 11C having a conductivity type of an $n^+$-type was set as 0.2 μm. Therefore, the number of the second-compound-semiconductor-layer lamination units $11C_U$ in which the 2-A compound semiconductor layer $11C_A$ and the 2-B compound semiconductor layer $11C_B$ are laminated is from 4 to 5 both inclusive.

EXAMPLE 3

Description on the predetermined sub-cell 11 has been given in Example 1 and Example 2. Description will be given on other sub-cells and the connection layer in Examples below.

Each of the sub-cells 11, 12, 13, and 14 is formed of a plurality of a plurality of compound semiconductor layers that are laminated. A configuration of each of the sub-cells 11, 12, 13, and 14 is shown in Table 5 below. It is to be noted that, in Table 5, concerning the compound semiconductor layers configuring each sub-cell, a compound semiconductor layer closer to the support substrate is described on a lower side, and a compound semiconductor layer farther from the support substrate is described on an upper side. Moreover, an amorphous connection layer 20 (connection layers 20A and 20B) made of an electrically-conductive material is provided in at least one place between the adjacent sub-cells, that is, between the second sub-cell 12 and the third sub-cell 13 that are of the lattice-mismatched type in Example 3. Here, the connection layer 20 is made of titanium (Ti) having a thickness of 1.0 nm. It is to be noted that the connection layer 20 has the two-dimensional layer structure and does not have the three-dimensional island structure.

TABLE 5

| |
|---|
| Fourth sub-cell 14: Band gap 1.90 eV, Lattice constant 5.653 Å |
| Compound semiconductor layer 14C: $n^+$-$In_{0.48}Ga_{0.52}P$ |
| Compound semiconductor layer 14B: p-$In_{0.48}Ga_{0.52}$ |
| Compound semiconductor layer 14A: $p^+$-$In_{0.48}Ga_{0.52}$ |
| Third sub-cell 13: Band gap 1.42 eV, Lattice constant 5.653 Å |
| Compound semiconductor layer 13C: $n^+$-GaAs |
| Compound semiconductor layer 13B: p-GaAs |
| Compound semiconductor layer 13A: $p^+$-GaAs |
| Second sub-cell 12: Band gap 1.02 eV, Lattice constant 5.868 Å |
| Compound semiconductor layer 12C: $n^+$-$In_{0.79}Ga_{0.21}As_{0.43}P_{0.57}$ |
| Compound semiconductor layer 12B: p-$In_{0.79}Ga_{0.21}As_{0.43}P_{0.57}$ |
| Compound semiconductor layer 12A: $p^+$-$In_{0.79}Ga_{0.21}As_{0.43}P_{0.57}$ |

First Sub-cell 11: See Example 1 or Example 2

Moreover, in the multi-function solar cell in Example 3, for example, a second electrode 19 configured of a lamination structure of AuGe/Ni/Au having thicknesses of 150 nm/50 nm/500 nm is formed on the fourth sub-cell 14, and an anti-reflection film 18 configured of a $TiO_2$ film and an $Al_2O_3$ film is formed on a portion, on the fourth sub-cell 14, on which the second electrode 19 is not formed. It is to be noted that, in the drawings, the second electrode 19 and the anti-reflection film 18 are each illustrated as one layer. The substrate for film-formation/support 31 is configured of a p-type InP substrate. Further, a first tunnel junction layer 15 configured of $p^+$-InGaAs (upper layer)/$n^+$-InGaAs (lower layer) is provided between the first sub-cell 11 and the second sub-cell 12 that are of the lattice-matched type, and a second tunnel junction layer 16 configured of $p^+$-InGaP (upper layer)/$n^+$-InGaP (lower layer) is provided between the third sub-cell 13 and the fourth sub-cell 14 that are of the lattice-matched type. Further, a window layer 17 configured of $n^+$-AlInP is formed between the fourth sub-cell 14, and the second electrode 19 and the anti-reflection film 18. It is to be noted that the window layer 17 is provided in order to prevent recombination of carriers in the uppermost surface, but may not be necessarily provided. The first electrode is connected to the first sub-cell 11; however, illustration of the first electrode is omitted.

Description will be given below of a method of manufacturing the multi-junction solar cell, the photoelectric conversion device, and the compound-semiconductor-layer lamination structure in Example 3 referring to (A) of FIG. 1, (A) to (B) of FIG. 2, and (A) to (B) of FIG. 3 that are conceptual diagrams of the compound semiconductor layers and the like.

[Step-300]

On the substrate for film-formation/support 31 configured of the p-type InP substrate, the first sub-cell 11 (the compound semiconductor layers $11A_1$, $11A_2$, and 11C), the first tunnel junction layer 15, and the second sub-cell 12 (the compound semiconductor layers 12A to 12C) that are of the lattice-matched type are epitaxially grown in a sequential manner based on an MOCVD method. On the other hand, on a substrate for film formation 44 configured of an n-type GaAs substrate, a sacrificial layer for peeling-off 45 configured of AlAs is formed, and then, the window layer 17 configured of $n^+$-AlInP is formed, based on the MOCVD method. Subsequently, on this window layer 17, the fourth sub-cell layer 14 (the compound semiconductor layers 14C to 14A), the second tunnel junction layer 16, and the third sub-cell 13 (the compound semiconductor layers 13C to 13A) that are of the lattice-matched type are epitaxially grown in a sequential manner. Thus, a structure shown in the conceptual diagram in (A) of FIG. 2 is obtained.

Next, the compound semiconductor layer 12C configured of $n^+$-$In_{0.79}Ga_{0.21}As_{0.43}P_{0.57}$ configuring the second compound semiconductor layer 12 is joined to the compound semiconductor layer 13A configured of $p^+$-GaAs configuring the third compound semiconductor layer 13 with the connection layer 20 in between, and thereby, ohmic contact is obtained.

[Step-310]

Specifically, first, the first connection layer 20A is formed on the compound semiconductor layer 12C configuring the second compound semiconductor layer 12, and the second connection layer 20B is formed on the compound semiconductor layer 13A configuring the third compound semiconductor layer 13 (see (B) of FIG. 2). More specifically, for example, the connection layers 20A and 20B each config-
ured of Ti with a film thickness of 0.5 nm may be formed on each of the compound semiconductor layer 12C and the compound semiconductor layer 13A based on a vacuum evaporation method (under conditions of: at a vacuum degree of $2\times10^{-4}$ Pa; at evaporation speed of 0.1 nm/sec or lower; and at a temperature from 150° C. to 200° C. both inclusive). It is to be noted that, in this case, for example, a resistance heating scheme may be adopted setting a substrate temperature at 80° C. and a substrate rotation speed at 30 rpm. However, the film formation method of the connection layers 20A and 20B is not limited thereto, and, for example, a sputtering method (under conditions of: at film formation speed of 0.1 nm/sec or lower; and at a temperature from 150° C. to 200° C. both inclusive) may be used.

[Step-320]

Subsequently, after performing plasma treatment on the connection layers 20A and 20B, the second compound semiconductor layer 12 is joined to the third compound semiconductor layer 13. Specifically, argon (Ar) plasma (for example, at plasma density from $10^9$ $cm^{-3}$ to $10^{11}$ $cm^{-3}$ both inclusive, and at a pressure from 1 Pa to $10^{-2}$ Pa both inclusive) is applied to surfaces of the connection layers 20A and 20B, and thereby, the surfaces (junction faces) of the connection layers 20A and 20B are activated. In other words, a dangling bond is formed in the junction interface (the surfaces of the connection layers 20A and 20B). Also, the connection layers 20A and 20B are allowed to be amorphous. Further, the connection layers 20A and 20B are joined (bonded) to each other while maintaining high degree of vacuum, that is, at an ambient pressure of $5\times10^{-4}$ Pa or lower, at junction load of $2\times10^4$ N or less, and at a temperature of 150° C. or lower, specifically, for example, at an ambient pressure of $1\times10^{-4}$ Pa, at junction load of $2\times10^4$ N, and at a temperature of 25° C. Thus, a structure illustrated in the conceptual diagram in (A) of FIG. 3 is obtained. In Example 3, metal (specifically, Ti) is used as the material of the connection layer 20. As described above, at the time of film formation, the metal thin film may be often formed in an island-like form, and a layer-like form is rarely obtained. However, film formation in the layer-like form is possible with the metal atoms in Group (A) and Group (B) shown in FIG. 13.

[Step-330]

Thereafter, the substrate for film formation 44 is peeled off, and the anti-reflection film 18 and the second electrode 19 are formed. Specifically, after the substrate for film formation 44 is peeled off by removing the sacrificial layer for peeling-off 45 is removed by etching (see (B) of FIG. 3), for example, a resist pattern may be formed on the window layer 17 based on a photolithography technique, and the second electrode 19 may be formed by a vacuum evaporation method (at vacuum degree of $2\times10^{-4}$ Pa, at evaporation speed of 0.1 nm/sec, and at a temperature from 150° C. to 200° C. both inclusive). It is to be noted that the substrate for film formation 44 is allowed to be reused. Next, by removing the resist pattern, the second electrode 19 is formed based on a lift-off method. Subsequently, a resist pattern is formed based on a photolithography technique, and, for example, the anti-reflection film 18 configured of a $TiO_2$ film and an $Al_2O_3$ film may be formed by a vacuum evaporation method (at vacuum degree of $2\times10^{-4}$ Pa, at evaporation speed of 0.1 nm/sec, and at a temperature from 150° C. to 200° C. both inclusive). Subsequently, by removing the resist pattern, the anti-reflection film 18 is formed based on a lift-off method. Thus, the multi-junction solar cell illustrated in (A) of FIG. 1 is obtained.

The multi-junction solar cell in Example 3 is configured of the plurality of sub-cells. By laminating the plurality of sub-cells configured of compound semiconductors having different band gaps (by achieving multi-junction), solar light that has a wide range of energy distribution is utilized efficiently. Further, in the multi-junction solar cell in Example 3, out of the plurality of sub-cells 11, 12, 13, and 14 configured of compound semiconductor layers having different compositions, at least the sub-cells having different lattice constants (in Example 3, between the second sub-cell 12 and the third sub-cell 13, $(Lc_1-Lc_2)/Lc_1=3.8\times10^{-2}$) are joined to each other with the connection layer 20 in between. The connection layer 20 is allowed to be formed in a layer-like form as a thin film (for example, of 5 nm or less), and in particular, achieves ohmic resistance with respect to the compound semiconductor layer. Also, by using titanium (Ti) having low resistivity, the contact resistance value of the junction portion is suppressed to $1\times10^{-3}$ $\Omega\cdot cm^2$ or smaller.

Usually, in surface activation by plasma application, plasma damage is caused in the junction surface. However, in Example 3, the connection layers 20A and 20B made of metal are formed on the surfaces of the second sub-cell 12 and the third sub-cell 13, then, the surfaces of the connection layers 20A and 20B are activated by plasma application, and thereafter, the connection layers 20A and 20B are joined to each other. Here, the connection layers 20A and 20B serve as protective films with respect to the second sub-cell 12 and the third sub-cell 13, and occurrence of plasma damage in the second sub-cell 12 and the third sub-cell 13 is prevented. Therefore, an increase in contact resistance caused by the plasma application is prevented. It is to be noted that the connection layer 20 configured of Ti formed by the vacuum evaporation method has become a layer having amorphous characteristics because of this plasma application. It is to be noted that conditions for the plasma application are set to conditions that allow collision energy of plasma to be relatively weak. In particular, conditions that cause damage in a region at several-ten nanometers or more from the surface are not used as usual, and conditions that damage a region only at several nanometers from the surface are used.

Moreover, in Example 3, the surfaces of the connection layers 20A and 20B are activated by the plasma application for junction, and therefore, junction is allowed to be formed at a low temperature of 150° C. or lower. Accordingly, compound semiconductor materials are allowed to be selected without being limited by thermal expansion coefficients. In other words, degree of freedom in selecting the compound semiconductor materials that configure the multi-junction solar cell is increased, and it becomes possible to select compound semiconductor materials that allow spacings of band gaps to be equal. Further, occurrence of damage in the junction face due to heating is also prevented.

By the way, the amounts of an n-type dopant and a p-type dopant added to the respective compound semiconductor layers are set to allow dopant concentration in the respective $n^+$-type and $p^+$-type compound semiconductor layers to be, for example, about from $1\times10^{16}$ $cm^{-3}$ to $5\times10^{19}$ $cm^{-3}$ both inclusive. However, when the dopant concentration of the $p^+$-GaAs layer is $1\times10^{19}$ $cm^{-3}$ or higher, light having a long wavelength may not be transmitted because of free carrier absorption. (A) and (B) of FIG. 15 show results of infrared microscopic transmission experiments for $p^+$-GaAs layer (dopant concentration: $2\times10^{19}$ $cm^{-3}$)/$n^+$-InP layer (dopant concentration: $4\times10^{18}$ $cm^{-3}$) and $n^+$-GaAs layer (dopant concentration: $2\times10^{18}$ $cm^{-3}$)/$n^+$-InP layer (dopant concentration: $4\times10^{18}$ $cm^{-3}$) at a wavelength from 1.1 µm to 1.2 µm both inclusive. It can be seen that, when the $n^+$-GaAs layer having low dopant concentration as $2\times10^{18}$ $cm^{-3}$ is used, light is transmitted as shown in (A) of FIG. 15, and on the other hand, when the $p^+$-GaAs layer having high dopant concentration as $2\times10^{19}$ $cm^{-3}$ is used, light is not transmitted as shown in (B) of FIG. 15. Accordingly, it can be found that the $p^+$-GaAs layer having high dopant concentration as $2\times10^{19}$ $cm^{-3}$ is not transparent with respect to light having a long wavelength. Therefore, when the film thickness of the $p^+$-GaAs layer is large, the $p^+$-GaAs layer becomes an absorption layer, and therefore, it is necessary to reduce the film thickness thereof depending on design. For example, in the $p^+$-GaAs layer having dopant concentration as $2\times10^{19}$ $cm^{-3}$, an absorption coefficient is as large as 2500 $cm^{-1}$ with respect to light having photon energy of 0.5 eV (having a wavelength of about 2.5 µm). Therefore, in order to allow light transmittance to be 90% or higher, the film thickness may be preferably 400 nm or less. Moreover, by allowing the film thickness to be 40 nm or less, the light transmittance is allowed to be 99% or higher.

Moreover, in order to improve efficiency in utilizing solar light, it is necessary to take in solar light spectrum in a wide range. The maximum wavelength of the solar light spectrum is 2.5 µm. However, as described above, when the concentration of the p-type dopant is high, light having a long wavelength is difficult to be transmitted. FIG. 16 shows a relationship between photon energy and absorption coefficients for each concentration of the p-type dopant in the p-type GaAs layer. It is to be noted that, in FIG. 16, "A" is data for p-type dopant concentration of $1.5\times10^{17}$, "B" is data for p-type dopant concentration of $1.1\times10^{19}$, "C" is data for p-type dopant concentration of $2.6\times10^{19}$, "D" is data for p-type dopant concentration of $6.0\times10^{19}$, and "E" is data for p-type dopant concentration of $1.0\times10^{20}$. As can be seen from FIG. 16, the p-type GaAs layer having p-type dopant concentration of $3\times10^{19}$ has an absorption coefficient of 4000 $cm^{-1}$ with respect to light having photon energy of 0.5 eV (a wavelength of about 2.5 µm). FIG. 17 shows a relationship between the thickness of the p-type GaAs layer having p-type dopant concentration of $3\times10^{19}$ and light transmittance of solar light having the maximum wavelength of 2.5 µm based on the data in FIG. 16. As can be seen from FIG. 17, in order to obtain light transmittance of solar light of 90% or higher, the film thickness of the p-type GaAs layer may be set to 270 nm or smaller, and in order to obtain light transmittance of 98% or higher, the film thickness thereof may be set to 50 nm or smaller. Further, it is found that, in order to obtain light transmittance of 99% or higher, the film thickness thereof may be set to 25 nm or smaller.

For reference, FIG. 18 shows a photograph of a bright-field image of an interface of the junction of the InP substrate and the GaAs substrate taken by a scanning transmission electron microscope. Here, an upper part of FIG. 18 is an interface obtained by directly joining the InP substrate to the GaAs substrate. Further, a middle part and a lower part of FIG. 18 are interfaces obtained by forming Ti layers having film thicknesses of 2.3 nm and 1.0 nm, on the InP substrate and the GaAs substrate, respectively, with the use of an evaporation apparatus of a resistance-heating scheme at vacuum degree of $2\times10^{-4}$ Pa, at evaporation speed of 0.1 nm/sec, at a substrate temperature of 80° C., and at substrate rotation speed of 30 rpm, and then, joining the two substrates to each other with these Ti layers in between. As can be seen from the photographs shown in the middle part and the lower part of FIG. 18, the layer-like Ti layers having substantially uniform film thicknesses are formed.

Moreover, for reference, an oxidation state of the Ti layer was examined. Generally, metal is easier to be naturallyoxidized compared to semiconductors. FIG. 19 shows variation in light transmittance over time of the Ti layer having a thickness of 2.0 nm for each wavelength. It is to be noted that, in FIG. 19, "A" is data in a case where the Ti layer is left in atmosphere for 2 hours, "B" is data in a case where the Ti layer is left in atmosphere for 24 hours, and "C" is data in a case where the Ti layer is left in atmosphere for 3 months. Further, FIG. 20 shows light transmittance after 2 hours have elapsed after the film formation (shown as "B" group in FIG. 20), and light transmittance after 24 hours have elapsed after the film formation (shown as "A" group in FIG. 20). As can be seen from FIG. 19 and FIG. 20, light transmittance is increased as the time elapses. In particular, based on FIG. 20, the light transmittance 24 hours after the film formation is increased by from 3% to 6% compared with the light transmittance 2 hours after the film formation. It can be considered that this is because a titanium oxide film ($TiO_2$) is formed on the surface of the Ti film due to exposure to atmosphere, and therefore, the film thickness of Ti is reduced. When an oxide film such as $TiO_2$ is formed, contact resistance in the junction interface is increased, and electric conductivity may be lowered.

Moreover, for reference, evaluation was done on plasma treatment (plasma application). The oxide film formed on the surfaces of the connection layers 20A and 20B is removed by the plasma treatment (the plasma application) at the same time as the time of activation of the surfaces of the connection layers 20A and 20B. Specifically, energy of ions that are incident on the surfaces of the connection layers 20A and 20B by the Ar plasma treatment is utilized to cut the bonding between the metal atom (Ti atom) and an oxygen atom and to allow the oxygen atom to be separated from the surfaces. FIG. 21 shows a result of quantitative analysis of concentration of each atom in each distance in a lamination direction of the multi-junction solar cell based on energy dispersive X-ray spectrometry (EDX). A content of oxygen (O) in a region at about 10 nm in which the connection layer 20 is formed is ⅓ or less compared to a content of Ti, and is sufficiently lower than that of $TiO_2$ (the number of O atoms is twice of that of the Ti atoms). Accordingly, it can be found that oxygen is removed by the application of Ar plasma. It is to be noted that, by the application of Ar plasma, impurities such as Fe, Cr, and Al may be mixed into the interfaces of the connection layers 20A and 20B from a material of components configuring a plasma treatment apparatus. However, a particular issue is not caused in characteristics.

Evaluation was done on the contact resistance $\rho_c$ of the connection layer. Specifically, in a manner similar to that in [Step-310] in Example 3, a Ti layer having a thickness of 1.8 nm was formed on the p-type GaAs substrate. On the other hand, in a manner similar to that in [Step-310] in Example 3, a Ti layer having a thickness of 1.8 nm was formed on the n-type InP substrate. Further, in a manner similar to that in [Step-320] in Example 3, after performing plasma treatment on these Ti layers, the Ti layers were joined to each other at an ambient pressure of $1\times10^{-4}$ Pa, at a junction load of $2\times10^4$ N, and at a temperature of 25° C. Further, an electrode configured of Ti/Pt/Au was formed on an outer face of the p-type GaAs substrate and an outer face of the n-type InP substrate. Further, current-voltage characteristics of Sample-1 obtained in such a manner were measured, and the contact resistance $\rho_c$ in the junction interface was obtained based on the measurement result. Accordingly, the following result was obtained.

$\rho_c(\text{Sample-1})=1.3\times10^{-4}\ \Omega\cdot cm^2$

In Sample-2 in which the thickness of the Ti layer was changed from 1.8 nm to 1.0 nm, the following result was obtained.

$\rho_c(\text{Sample-2})=1.5\times10^{-4}\ \Omega\cdot cm^2$

It is to be noted that, in Sample-3 in which an electrode configured of Ti/Pt/Au was formed on each of the both faces of the p-type GaAs substrate, the following result was obtained.

$\rho_c(\text{Sample-3})=8.1\times10^{-5}\ \Omega\cdot cm^2$

Further, Sample-4 in which an electrode configured of Ti/Pt/Au was formed on each of the both faces of the n-type InP substrate, the following result was obtained.

$\rho_c(\text{Sample-4})=5.4\times10^{-5}\ \Omega\cdot cm^2$

In these measurements, favorable linear ohmic contact was obtained. As can be seen from the above-described results, $\rho_c \leq 1\times10^{-3}\ \Omega\cdot cm^2$ is achieved when the connection layer 20 is configured of the Ti layer having a thickness of 5 nm or less. Moreover, the contact resistance of Sample-1 or the contact resistance of Sample-2 is almost equal to sum of the contact resistance of Sample-3 and the contact resistance of Sample-4. Accordingly, it is found that electric loss in a case where the p-type GaAs substrate is joined to the n-type InP substrate with the use of the connection layer configured of the Ti layer is almost "0", and ideal junction is achieved.

Moreover, current-voltage characteristics were measured for Sample-5 in which the surfaces of the p-type GaAs substrate and the n-type InP substrate were allowed to be in an amorphous state, and the p-type GaAs substrate was joined to the n-type InP substrate through these surfaces in a method same as that in Sample-1, and for Sample-6 in which the thickness of the Ti layer was changed to 0.5 nm (a fabricating method is the same as that in Sample-1). As a result, current-voltage characteristics similar to those of Sample-1 were obtained. Accordingly, it is found that favorable linear ohmic contact is obtained also in the case where the compound semiconductor layers are allowed to be in the amorphous state and the junction is formed using them as the connection layers.

It is to be noted that, results similar to those described above were obtained also in a case where the connection layer was configured of Ti layer/Al layer instead of Ti layer/Ti layer.

EXAMPLE 4

Example 4 is a modification of Example 3. (A) of FIG. 4 illustrates a conceptual diagram of a multi-junction solar cell, a photoelectric conversion device, and a compound-semiconductor-layer lamination structure in Example 4. In Example 4, a connection layer 21 has a lamination structure configured of a plurality of types (two types, in Example 4) of metal thin films. Specifically, for example, a Ti layer (a connection layer 21A) having a thickness of 0.5 nm may be formed on the compound semiconductor layer 12C configured of $n^+$-$In_{0.79}Ga_{0.21}As_{0.43}P_{0.57}$ configuring the second sub-cell 12, and on the other hand, for example, an Al film (a connection layer 21B) having a thickness of 0.5 nm may be formed on the compound semiconductor layer 13A configured of $p^+$-GaAs configuring the third sub-cell 13. Subsequently, Ar plasma application is performed on these connection layers 21A and 21B to activate surfaces thereof in a manner similar to that in [Step-320] in Example 3. Also, the connection layers 21A and 21B are allowed to be amorphous, and then, are joined to each other. FIG. 22 shows a photograph of a cross-section, of a bonding junction interface, obtained by a transmission electron microscope. As can be seen from FIG. 22, because the connection layers are amorphous, crystal lattice is not viewable in the transmission electron microscope image. It is to be noted that metal used as the connection layer 21 may be selected appropriately from metal having ohmic characteristics and capable of forming a layer having a thickness of several nanometers or smaller, that may be, Al, Ti, Zr, Hf, W, Ta, Mo, Nb, or V. A combination of metal used as the connection layers 21A and 21B is not particularly limited. Metal exhibiting electric characteristics with favorable ohmic characteristics with respect to the compound semiconductor layers 12C and 13A forming the sub-cells 12 and 13 may be selected separately for the connection layers 21A and 21B, respectively. Further, accordingly, contact resistance is suppressed to the minimum.

EXAMPLE 5

Example 5 is also a modification of Example 3. Example 5 is different from Example 3 in that a connection layer 22 is configured of amorphous layers of compound semiconductors configuring the respective second sub-cell 12 and third sub-cell 13. (B) of FIG. 4 illustrates a conceptual diagram of a multi-junction solar cell, a photoelectric conversion device, and a compound-semiconductor-layer lamination structure in Example 5.

The connection layer 22 in Example 5 is configured of an n$^+$-In$_{0.79}$Ga$_{0.21}$As$_{0.43}$P$_{0.57}$ amorphous layer (a connection layer 22A) and a p$^+$-GaAs amorphous layer (a connection layer 22B). The n$^+$-In$_{0.79}$Ga$_{0.21}$As$_{0.43}$P$_{0.57}$ amorphous layer is obtained by allowing part of the compound semiconductor layer 12C configured of n$^+$-In$_{0.79}$Ga$_{0.21}$As$_{0.43}$P$_{0.57}$ configuring the second sub-cell 12 to be amorphous. The p$^+$-GaAs amorphous layer is obtained by allowing part of the compound semiconductor layer 13A configured of p$^+$-GaAs configuring the third sub-cell 13 to be amorphous. Dopant concentration of the connection layer 22A and the connection layer 22B may be, for example, from $1\times10^{18}$ cm$^{-3}$ to $5\times10^{19}$ cm$^{-3}$ both inclusive. A film thickness of the connection layer 22 may be preferably from 0.5 nm to 3.0 nm both inclusive, for example. Further, film thicknesses of the connection layers 22A and 22B may be preferably a half of that of the connection layer 22 after the junction, that is, from 0.25 nm to 1.5 nm both inclusive.

In Example 5, after forming the compound semiconductor layers, in a manner similar to that in [Step-320] in Example 3, the surfaces of the compound semiconductor layer 12C and the compound semiconductor layer 13A are activated by plasma treatment, and also, after the surfaces are allowed to be amorphous, the second sub-cell 12 is joined to the third sub-cell 13. Specifically, Ar plasma (for example, at plasma density from $10^9$ cm$^{-3}$ to $10^{11}$ cm$^{-3}$ both inclusive, and at a pressure from 1 Pa to $10^{-2}$ Pa both inclusive) is applied to surfaces of the compound semiconductor layer 12C configured of n$^+$-In$_{0.79}$Ga$_{0.21}$As$_{0.43}$P$_{0.57}$ and the compound semiconductor layer 13A configured of p$^+$-GaAs, and plasma damage is caused on the surface of each of the compound semiconductor layers 12C and 13A. Accordingly, for example, an amorphous layer (the connection layers 22A and 22B) having a film thickness of 1.0 nm may be formed. Further, the connection layers 22A and 22B are bonded to each other while maintaining high degree of vacuum (for example, at $5\times10^{-4}$ Pa or lower), at junction load of $2\times10^4$ N or less and at a temperature of 150° C. or lower, in particular, for example, at an ambient pressure of $1\times10^{-4}$ Pa, at junction load of $2\times10^4$ N, and at a temperature of 25° C., and thereby, the second sub-cell 12 is joined to the third sub-cell 13.

In Example 5, the crystal structure of part of the compound semiconductor layers configuring each sub-cell is allowed to be amorphous between the sub-cells having different lattice constants, and this is used as the connection layers 22A and 22B. Accordingly, in a manner similar to that in Example 3, a multi-junction solar cell in which contact resistance in the junction interface of the joined compound semiconductor layers is low and high energy conversion efficiency is achieved is obtained. Further, in addition to such an effect, the step of forming the connection layer configured of metal becomes unnecessary. Therefore, manufacturing process is simplified, and manufacture cost is reduced.

EXAMPLE 6

Example 6 is also a modification of Example 3. Example 6 is different from Example 3 in that a first substrate for film formation and a second substrate for film formation are used, and these first substrate for film formation and second substrate for film formation are peeled off at last.

Description will be given below of a method of manufacturing a multi-junction solar cell and a photoelectric conversion device in Example 6 referring to (A) to (B) of FIG. 5, (A) to (B) of FIG. 6, and FIG. 7 that are conceptual diagrams of the compound semiconductor layers and the like.

[Step-600]

First, a first sacrificial layer for peeling-off 42 made of AlInAs and an n$^+$-InP layer 43 that is to serve as a contact layer are formed on a first substrate for film formation 41 configured of an n-type InP substrate, and then, the second sub-cell 12, the first tunnel junction layer 15, and the first sub-cell 11 are sequentially formed on the n$^+$-InP layer 43. However, the formation of the n$^+$-InP layer 43 is not essential, and the formation may be omitted as in Example 3 to Example 5. The same is applicable also to Example 7 which will be described later. On the other hand, a second sacrificial layer for peeling-off 46 made of AlAs is formed on a second substrate for film formation 44 made of an n-type GaAs substrate, and then, the window layer 17, the fourth sub-cell 14, the second tunnel junction layer 16, and the third sub-cell 13 are sequentially formed. Thus, a structure shown in the conceptual diagram in (A) of FIG. 5 is obtained. It is to be noted that the n$^+$-InP layer 43 that is to serve as the contact layer may be formed in the multi-junction solar cells described in Example 3 to Example 5.

[Step-610]

Further, the first substrate for film formation 41 is peeled off by removing the first sacrificial layer for peeling-off 42 by etching after the surface of the first sub-cell 11 is bonded to the support substrate 32 (see (B) of FIG. 5). Thereafter, for example, the connection layer 20A made of Ti may be formed on the n$^+$-InP layer 43 formed on the compound semiconductor layer 12C made of n$^+$-In$_{0.79}$Ga$_{0.21}$As$_{0.43}$P$_{0.57}$ configuring the second sub-cell 12. On the other hand, for example, the connection layer 20B made of Ti may be formed on the compound semiconductor layer 13A made of p$^+$-GaAs configuring the third sub-cell 13. It is to be noted that the connection layers 20A and 20B are allowed to be formed in a manner similar to that in [Step-310] in Example 3. Thus, a structure shown in the conceptual diagram in (A) of FIG. 6 is obtained.

[Step-620]

Next, in a manner similar to that in [Step-320] in Example 3, the surfaces of the connection layers 20A and 20B are activated by Ar plasma application, and at the same time, are allowed to be amorphous. Thereafter, the connection layers 20A and 20B are joined to each other (see (B) of FIG. 6). Thereafter, after the second substrate for film formation 44 is peeled off by removing the second sacrificial layer for peeling-off 46 by etching, the second electrode 19 and the anti-reflection film 18 are formed in a manner similar to that in [Step-330] in Example 3. Thus, the multi-junction solar cell in Example 6 shown in the conceptual diagram in FIG. 7 is obtained.

In Example 6, not only the second substrate for film formation but also the first substrate for film formation is peeled off. Accordingly, the n-type GaAs substrate and the n-type InP substrate are both allowed to be reused, and therefore, manufacturing cost is further reduced.

It is to be noted that, in Example 6, although the connection layer is configured of Ti as in Example 3, the connection layer may have a configuration similar to that in Example 4 or Example 5. The same is applicable also to Example 7 which will be described next.

EXAMPLE 7

Example 7 is a modification of Example 6. Example 7 is different from Example 6 in that the first substrate for film formation and the second substrate for film formation are peeled off after the second sub-cell and the first sub-cell are formed on the first substrate for film formation and the third sub-cell and the fourth sub-cell are formed on the second substrate for film formation.

Description will be given below of a method of manufacturing a multi-junction solar cell and a photoelectric conversion device in Example 7 referring to (A) to (B) of FIG. 8, (A) to (B) of FIG. 9, and (A) to (B) of FIG. 10 that are conceptual diagrams of the compound semiconductor layers and the like.

[Step-700]

First, in a manner similar to that in [Step-600] in Example 6, the first sacrificial layer for peeling-off 42, the $n^+$-InP layer 43, the second sub-cell 12, the first tunnel junction layer 15, and the first sub-cell 11 are sequentially formed on the first substrate for film formation 41 configured of the n-type InP substrate. On the other hand, the second sacrificial layer for peeling-off 46, the third sub-cell 13, the second tunnel junction layer 16, the fourth sub-cell 14, the window layer 17, and a third sacrificial layer for peeling-off 47 are sequentially formed on the second substrate for film formation 44 configured of an n-type GaAs substrate. Thus, a structure shown in the conceptual diagram in (A) of FIG. 8 is obtained.

[Step-710]

Thereafter, the first substrate for film formation 41 is peeled off by removing the first sacrificial layer for peeling-off 42 by etching. Further, the second substrate for film formation 44 is peeled off by removing the second sacrificial layer for peeling-off 46 by etching. Thus, a structure shown in the conceptual diagram in (B) of FIG. 8 is obtained.

[Step-720]

Next, for example, the connection layer 20A made of Ti may be formed on the $n^+$-InP layer 43 formed on the compound semiconductor layer 12C made of $n^+$-In$_{0.79}$Ga$_{0.21}$As$_{0.43}$P$_{0.57}$ configuring the second sub-cell 12. On the other hand, for example, the connection layer 20B made of Ti may be formed on the compound semiconductor layer 13A made of $p^+$-GaAs configuring the third sub-cell 13. It is to be noted that the connection layers 20A and 20B are allowed to be formed in a manner similar to that in [Step-310] in Example 3. Thus, a structure shown in the conceptual diagram in (A) of FIG. 9 is obtained.

[Step-730]

Thereafter, for example, the first sub-cell 11 may be bonded to the support substrate 33 and the third sacrificial layer for peeling-off 47 may be bonded to the support substrate 34 with the use of wax, a resist having high viscosity, or the like. Thus, a structure shown in the conceptual diagram in (B) of FIG. 9 is obtained.

[Step-740]

Subsequently, in a manner similar to that in [Step-320] in Example 3, the surfaces of the connection layers 20A and 20B are activated by Ar plasma application, and at the same time, are allowed to be amorphous. Thereafter, the connection layers 20A and 20B are joined to each other (see (A) of FIG. 10). Thereafter, the support substrate 34 is peeled off by removing the third sacrificial layer for peeling-off 47 by etching. Subsequently, the second electrode 19 and the anti-reflection film 18 are formed in a manner similar to that in [Step-330] in Example 3. Thus, the multi-junction solar cell in Example 7 shown in the conceptual diagram in (B) of FIG. 10 is obtained.

Hereinabove, the present disclosure has been described based on preferable Examples. However, the present disclosure is not limited to these Examples. The configurations, the structures, the compositions, and the like of the multi-junction solar cell, the photoelectric conversion device, the compound-semiconductor-layer lamination structure, or the like in the Examples are allowed to be changed as appropriate. It is not necessary to provide all of the various compound semiconductor layers configuring the multi-junction solar cells, the photoelectric conversion devices, and the like described in the Examples, and other layers may be provided. Further, the junction of the connection layers 20A and 20B may be formed, for example, at 200° C., and thereby, contact resistance of the junction interface is further reduced.

Since the substrate for film formation is removed at last, the conductivity type of the substrate may be either the n-type or the p-type. Further, since the substrate for film formation is allowed to be reused, the manufacturing cost of the multi-junction solar cell, the photoelectric conversion device, and the like is reduced.

For example, the multi-junction solar cell shown in the conceptual diagram in (A) of FIG. 1 may be a structure in which the connection layer 20 is extended to an outer side and may configure a third electrode as shown in FIG. 11. Accordingly, a parallel multi-junction solar cell is configured that is allowed to easily face a region in which spectrum of solar light is different from AM1.5, variation in climate, etc. It is to be noted that, in the multi-junction solar cell shown in FIG. 11, a lamination order of compound semiconductor layers 11A$_1$, 11A$_2$, and 11C, and the compound semiconductor layers 12A, 12B, and 12C in the first sub-cell 11 and the second sub-cell 12 is the reverse of a lamination order of the compound semiconductor layers 11A$_1$, 11A$_2$, and 11C and the compound semiconductor layers 12A, 12B, and 12C in the first sub-cell 11 and the second sub-cell 12 in the multi-junction solar cell in Example 1 and Example 3 shown in (A) of FIG. 1, and the first sub-cell 11 and the second sub-cell 12 are connected in parallel to the third sub-cell 13 and the fourth sub-cell 14. Further, in order to reduce electric resistance to the third electrode, for example, a thickness of the $p^+$-InP layer 43 may be desirably larger.

In the Examples, a configuration including, in order from the light incident side, for example, Fourth sub-cell: InGaP layer Third sub-cell: GaAs layer Second sub-cell: InGanAsP layer First sub-cell: InGaAs layer has been adopted. However, alternatively, for example, [Configuration-A] to [Configuration-D] that are configurations shown in Table 6 below in order from the light incident side may be adopted. Alternatively, Table 7 below shows [Configuration-E] to [Configuration-G] that are each a configuration in which the third sub-cell, the fourth sub-cell, and the fifth sub-cell are formed on the GaAs substrate, the first sub-cell and the second sub-cell are formed on the InP substrate, and the second sub-cell is joined to the third sub-cell. Moreover, Table 8 below shows [Configuration-H] to [Configuration-K] that are each a configuration in which the second sub-cell, the third sub-cell, and the fourth sub-cell are formed on the GaAs substrate, the first sub-cell is formed on the InP substrate, and the first sub-cell is joined to the second sub-cell. The first sub-cell in Table 6 to Table 8 corresponds to the first sub-cell in the Examples, and has the distortion compensation lamination structure. It is to be noted that a third column in Table 6 to Table 8 shows values of band gaps, and a fourth column therein shows values of lattice constants. Further, the value of the lattice constant of the first sub-cell is an average lattice constant value. Further, in Table 6 to Table 8, compound semiconductor layers that have the same composition but have different values of band gaps or different values of lattice constants have different atomic percentages.

TABLE 6

| [Configuration-A] | | | |
|---|---|---|---|
| Fourth sub-cell | InGaP layer | 1.90 eV | 5.653 Å |
| Third sub-cell | $In_{0.01}Ga_{0.99}As$ layer | 1.40 eV | 5.657 Å |
| Second sub-cell | InGaAsP layer | 1.03 eV | 5.868 Å |
| First sub-cell | $In_{0.32}Ga_{0.68}As/$ $In_{0.74}Ga_{0.26}As$ layer | 0.55 eV | 5.868 Å |
| [Configuration-B] | | | |
| Fourth sub-cell | AlInGaP layer | 2.10 eV | 5.722 Å |
| Third sub-cell | $In_{0.65}Ga_{0.35}P$ layer | 1.66 eV | 5.722 Å |
| Second sub-cell | InGaAsP layer | 1.03 eV | 5.868 Å |
| First sub-cell | $In_{0.32}Ga_{0.68}As/$ $In_{0.74}Ga_{0.26}As$ layer | 0.55 eV | 5.868 Å |
| [Configuration-C] | | | |
| Fourth sub-cell | InGaP layer | 1.90 eV | 5.653 Å |
| Third sub-cell | $In_{0.01}Ga_{0.99}As$ layer | 1.40 eV | 5.657 Å |
| Second sub-cell | InGaAsP layer | 1.03 eV | 5.868 Å |
| First sub-cell | $In_{0.45}Ga_{0.55}As/$ $In_{0.63}Ga_{0.37}As$ layer | 0.65 eV | 5.868 Å |
| [Configuration-D] | | | |
| Fourth sub-cell | AlInGaP layer | 2.10 eV | 5.722 Å |
| Third sub-cell | $In_{0.65}Ga_{0.35}P$ layer | 1.66 eV | 5.722 Å |
| Second sub-cell | InGaAsP layer | 1.03 eV | 5.868 Å |
| First sub-cell | $In_{0.45}Ga_{0.55}As/$ $In_{0.63}Ga_{0.37}As$ layer | 0.65 eV | 5.868 Å |

TABLE 7

| [Configuration-E] | | | |
|---|---|---|---|
| Fifth sub-cell | $Al_{0.015}InGa_{0.985}P$ layer | 1.90 eV | 5.653 Å |
| Fourth sub-cell | GaAs layer | 1.42 eV | 5.653 Å |
| Third sub-cell | InGaAsN layer | 1.00 eV | 5.653 Å |
| Second sub-cell | $In_{0.53}Ga_{0.47}As$ layer | 0.75 eV | 5.868 Å |
| First sub-cell | $In_{0.32}Ga_{0.68}As/$ $In_{0.74}Ga_{0.26}As$ layer | 0.55 eV | 5.868 Å |
| [Configuration-F] | | | |
| Fifth sub-cell | $Al_{0.015}InGa_{0.985}P$ layer | 1.90 eV | 5.653 Å |
| Fourth sub-cell | $In_{0.01}Ga_{0.99}As$ layer | 1.40 eV | 5.657 Å |
| Third sub-cell | InGaAsN layer | 1.00 eV | 5.653 Å |
| Second sub-cell | $In_{0.53}Ga_{0.47}As$ layer | 0.75 eV | 5.868 Å |
| First sub-cell | $In_{0.32}Ga_{0.68}As/$ $In_{0.74}Ga_{0.26}As$ layer | 0.55 eV | 5.868 Å |
| [Configuration-G] | | | |
| Fifth sub-cell | $Al_{0.27}InGa_{0.73}P$ layer | 2.20 eV | 5.653 Å |
| Fourth sub-cell | InGaP layer | 1.80 eV | 5.657 Å |
| Third sub-cell | GaAs layer | 1.42 eV | 5.653 Å |
| Second sub-cell | InGaAsP layer | 1.03 eV | 5.868 Å |
| First sub-cell | $In_{0.45}Ga_{0.55}As/$ $In_{0.63}Ga_{0.37}As$ layer | 0.65 eV | 5.868 Å |

TABLE 8

| [Configuration-H] | | | |
|---|---|---|---|
| Fourth sub-cell | InGaP layer | 1.90 eV | 5.653 Å |
| Third sub-cell | $In_{0.01}Ga_{0.99}As$ layer | 1.40 eV | 5.657 Å |
| Second sub-cell | InGaAsN layer | 1.00 eV | 5.653 Å |
| First sub-cell | $In_{0.32}Ga_{0.68}As/$ $In_{0.74}Ga_{0.26}As$ layer | 0.55 eV | 5.868 Å |
| [Configuration-I] | | | |
| Fourth sub-cell | InGaP layer | 1.90 eV | 5.653 Å |
| Third sub-cell | GaAs layer | 1.42 eV | 5.653 Å |
| Second sub-cell | InGaAsN layer | 1.00 eV | 5.653 Å |
| First sub-cell | $In_{0.32}Ga_{0.68}As/$ $In_{0.74}Ga_{0.26}As$ layer | 0.55 eV | 5.868 Å |
| [Configuration-J] | | | |
| Fourth sub-cell | InGaP layer | 1.90 eV | 5.653 Å |
| Third sub-cell | $In_{0.01}Ga_{0.99}As$ layer | 1.40 eV | 5.657 Å |
| Second sub-cell | InGaAsN layer | 1.00 eV | 5.653 Å |
| First sub-cell | $In_{0.45}Ga_{0.55}As/$ $In_{0.63}Ga_{0.37}As$ layer | 0.65 eV | 5.868 Å |
| [Configuration-K] | | | |
| Fourth sub-cell | InGaP layer | 1.90 eV | 5.653 Å |
| Third sub-cell | GaAs layer | 1.42 eV | 5.653 Å |
| Second sub-cell | InGaAsN layer | 1.00 eV | 5.653 Å |
| First sub-cell | $In_{0.45}Ga_{0.55}As/$ $In_{0.63}Ga_{0.37}As$ layer | 0.65 eV | 5.868 Å |

Moreover, it is not limited to the four-junction type as described above, and a multi-junction solar cell having less-than-four junctions may be achieved, or a multi-junction solar cell having five-or-more junctions (for example, AlInGaP layer/InGaP layer/AlGaAs layer/InGaAs layer/InGaAsN layer/Ge layer) may be achieved.

It is to be noted that the present disclosure may also have configurations such as the followings.

[1] [Solar Cell]

A multi-junction solar cell, the multi-junction solar cell including a plurality of sub-cells that are laminated, in which light enters from the sub-cell located in an uppermost layer to the sub-cell located in a lowermost layer, and electric power is generated in each of the sub-cells, each of the sub-cells including a first compound semiconductor layer and a second compound semiconductor layer that are laminated, the first compound semiconductor layer having a first conductivity type, and the second compound semiconductor layer having a second conductivity type, wherein, in at least one predetermined sub-cell of the plurality of sub-cells, the first compound semiconductor layer is configured of at least one first-compound-semiconductor-layer lamination unit in which a 1-A compound semiconductor layer and a 1-B compound semiconductor layer are laminated, the 1-A compound semiconductor layer having the first conductivity type, and the 1-B compound semiconductor layer having the first conductivity type the second conductivity type, the second compound semiconductor layer is configured of at least one second-compound-semiconductor-layer lamination unit in which a 2-A compound semiconductor layer and a 2-B compound semiconductor layer are laminated, the 2-A compound semiconductor layer having the second conductivity type that is different from the first conductivity type, and the 2-B compound semiconductor layer having the second conductivity type, a compound semiconductor composition configuring the 1-A compound semiconductor layer and a compound semiconductor composition configuring the 2-A compound semiconductor layer are same compound semiconductor composition A, a compound semiconductor composition configuring the 1-B compound semiconductor layer and a compound semiconductor composition configuring the 2-B compound semiconductor layer are same compound semiconductor composition B, the compound semiconductor composition A is determined based on a value of a band gap of the predetermined sub-cell, the compound semiconductor composition B is determined based on a difference between a base lattice constant of a base used at a time of forming the first and second compound semiconductor layers and a lattice constant of the compound semiconductor composition A, a thickness of the 1-B compound semiconductor layer is determined based on a difference between the base lattice constant and a lattice constant of the compound semiconductor composition B, and on a thickness of the 1-A compound semiconductor layer, a thickness of the 2-B compound semiconductor layer is determined based on the difference between the base lattice constant and the lattice constant of the compound semiconductor composition B, and on a thickness of the 2-A compound semiconductor layer, the thicknesses of the 1-A compound semiconductor layer and the 2-A compound semiconductor layer are smaller than a critical film thickness of the compound semiconductor composition A, and are thicknesses that cause no quantum effect, and the thicknesses of the 1-B compound semiconductor layer and the 2-B compound semiconductor layer are smaller than a critical film thickness of the compound semiconductor composition B, and are thicknesses that cause no quantum effect.

[2] The multi-junction solar cell according to [1], wherein the predetermined sub-cell is located in the lowermost layer.

[3] The multi-junction solar cell according to [1] or [2], wherein a group of atoms configuring the compound semiconductor composition A is same as a group of atoms configuring the compound semiconductor composition B.

[4] The multi-junction solar cell according to [3], wherein atomic percentage of the group of atoms configuring the compound semiconductor composition A is different from atomic percentage of the group of atoms configuring the compound semiconductor composition B.

[5] The multi-junction solar cell according to any one of [1] to [4], wherein the value of the band gap of the predetermined sub-cell is from 0.45 eV to 0.75 eV both inclusive.

[6] The multi-junction solar cell according to any one of [1] to [5], wherein a value of a band gap of the compound semiconductor composition B is larger than a value of a band gap of the compound semiconductor composition A.

[7] The multi-junction solar cell according to any one of [1] to [6], wherein $|(LC_A - LC_0)/LC_0| \leq 1 \times 10^{-3}$ and $0.25 \leq |(LC_B - LC_0)/(LC_A - LC_0)| \leq 4.0$ are satisfied where $LC_A$ is the lattice constant of the compound semiconductor composition A, $LC_B$ is the lattice constant of the compound semiconductor composition B, and $LC_0$ is the base lattice constant.

[8] The multi-junction solar cell according to [7], wherein $LC_A - LC_0 > 0$ and $LC_B - LC_0 < 0$ are established.

[9] The multi-junction solar cell according to any one of [1] to [8], wherein $-1 \times 10^{-3} \leq \{(t_B \cdot LC_B + t_A \cdot LC_A)/(t_B + t_A) - LC_0\}/LC_0 \leq 1 \times 10^{-3}$ is satisfied where $LC_A$ is the lattice constant of the compound semiconductor composition A, $LC_B$ is the lattice constant of the compound semiconductor composition B, $LC_0$ is the base lattice constant, $t_A$ is the thickness of the 1-A compound semiconductor layer and the 2-A compound semiconductor layer, and $t_B$ is the thickness of the 1-B compound semiconductor layer and the 2-B compound semiconductor layer.

[10] The multi-junction solar cell according to any one of [1] to [9], wherein the base is formed of InP, the compound semiconductor composition A is $In_xGa_{1-x}As$, and the compound semiconductor composition B is $In_yGa_{1-y}As$ (where x>y).

[11] The multi-junction solar cell according to [10], wherein $0.53 \leq x \leq 0.86$ and $0 \leq y \leq 0.53$ are established.

[12] [Photoelectric Conversion Device]

A photoelectric conversion device, the photoelectric conversion device including a first compound semiconductor layer and a second compound semiconductor layer that are laminated, the first compound semiconductor layer having a first conductivity type, and the second compound semiconductor layer having a second conductivity type, wherein the first compound semiconductor layer is configured of at least one first-compound-semiconductor-layer lamination unit in which a 1-A compound semiconductor layer and a 1-B compound semiconductor layer are laminated, the 1-A compound semiconductor layer having the first conductivity type, and the 1-B compound semiconductor layer having the first conductivity type the second conductivity type, the second compound semiconductor layer is configured of at least one second-compound-semiconductor-layer lamination unit in which a 2-A compound semiconductor layer and a 2-B compound semiconductor layer are laminated, the 2-A compound semiconductor layer having the second conductivity type that is different from the first conductivity type, and the 2-B compound semiconductor layer having the second conductivity type, a compound semiconductor composition configuring the 1-A compound semiconductor layer and a compound semiconductor composition configuring the 2-A compound semiconductor layer are same compound semiconductor composition A, a compound semiconductor composition configuring the 1-B compound semiconductor layer and a compound semiconductor composition configuring the 2-B compound semiconductor layer are same compound semiconductor composition B, the compound semiconductor composition A is determined based on a value of a band gap of the photoelectric conversion device, the compound semiconductor composition B is determined based on a difference between a base lattice constant of a base used at a time of forming the first and second compound semiconductor layers and a lattice constant of the compound semiconductor composition A, a thickness of the 1-B compound semiconductor layer is determined based on a difference between the base lattice constant and a lattice constant of the compound semiconductor composition B, and on a thickness of the 1-A compound semiconductor layer, a thickness of the 2-B compound semiconductor layer is determined based on the difference between the base lattice constant and the lattice constant of the compound semiconductor composition B, and on a thickness of the 2-A compound semiconductor layer, the thicknesses of the 1-A compound semiconductor layer and the 2-A compound semiconductor layer are smaller than a critical film thickness of the compound semiconductor composition A, and are thicknesses that cause no quantum effect, and the thicknesses of the 1-B compound semiconductor layer and the 2-B compound semiconductor layer are smaller than a critical film thickness of the compound semiconductor composition B, and are thicknesses that cause no quantum effect.

[13] [Compound-semiconductor-layer Lamination Structure]

A compound-semiconductor-layer lamination structure, the compound-semiconductor-layer lamination structure including at least one compound-semiconductor-layer lamination unit in which an A compound semiconductor layer and a B compound semiconductor layer are laminated, a compound semiconductor composition B configuring the B compound semiconductor layer is determined based on a difference between a base lattice constant of a base used at a time of forming the A and B compound semiconductor layers and a lattice constant of a compound semiconductor composition A configuring the A compound semiconductor layer, a thickness of the B compound semiconductor layer is determined based on a difference between the base lattice constant and a lattice constant of the compound semiconductor composition B, and on a thickness of the A compound semiconductor layer, the thickness of the A compound semiconductor layer is smaller than a critical film thickness of the compound semiconductor composition A, and is a thickness that causes no quantum effect, and the thicknesses of the B compound semiconductor layer is smaller than a critical film thickness of the compound semiconductor composition B, and is a thickness that causes no quantum effect.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A multi junction solar cell comprising:
a plurality of sub-cells that are laminated, in which light enters from a sub-cell located in an uppermost layer to a sub-cell located in a lowermost layer, and electric power is generated in each of the plurality of sub-cells, the each of the plurality of sub-cells including a first compound semiconductor layer and a second compound semiconductor layer that are laminated, the first compound semiconductor layer having a first conductivity type, and the second compound semiconductor layer having a second conductivity type, wherein, in at least one predetermined sub-cell of the plurality of sub-cells,
the first compound semiconductor layer is comprised of at least one first compound semiconductor layer lamination unit in which a 1-A compound semiconductor layer and a 1-B compound semiconductor layer are laminated, the 1-A compound semiconductor layer having the first conductivity type, and the 1-B compound semiconductor layer having the first conductivity type, the second compound semiconductor layer is comprised of at least one second compound semiconductor layer lamination unit in which a 2-A compound semiconductor layer and a 2-B compound semiconductor layer are laminated, the 2-A compound semiconductor layer having the second conductivity type that is different from the first conductivity type, and the 2-B compound semiconductor layer having the second conductivity type, a compound semiconductor composition in the 1-A compound semiconductor layer and a compound semiconductor composition comprised of the 2-A compound semiconductor layer are $In_xGa_{1-x}As$, a compound semiconductor composition comprised of the 1-B compound semiconductor layer and a compound semiconductor composition comprised of the 2-B compound semiconductor layer are $In_yGa_{1-y}As$, wherein x>y, the $In_xGa_{1-x}As$ is determined based on a value of a band gap of the at least one predetermined sub-cell, the $In_yGa_{1-y}As$ is determined based on a difference between a base lattice constant of a base used at a time of forming the first and second compound semiconductor layers and a lattice constant of the $In_xGa_{1-x}As$, wherein the base is formed of InP, a thickness of the 1-B compound semiconductor layer is determined based on a difference between the base lattice constant and a lattice constant of the $In_yGa_{1-y}As$, and on a thickness of the 1-A compound semiconductor layer, a thickness of the 2-B compound semiconductor layer is determined based on the difference between the base lattice constant and the lattice constant of the $In_yGa_{1-y}As$, and on a thickness of the 2-A compound semiconductor layer, the thicknesses of the 1-A compound semiconductor layer and the 2-A compound semiconductor layer are smaller than a critical film thickness of the $In_xGa_{1-x}As$, and are thicknesses that cause no quantum effect, and the thicknesses of the 1-B compound semiconductor layer and the 2-B compound semiconductor layer are smaller than a critical film thickness of the $In_yGa_{1-y}As$, and are thicknesses that cause no quantum effect.

2. The multi junction solar cell according to claim 1, wherein the at least one predetermined sub-cell is located in the lowermost layer.

3. The multi junction solar cell according to claim 1, wherein a value of a band gap of the at least one predetermined sub-cell is from 0.45 eV to 0.75 eV both inclusive.

4. The multi junction solar cell according to claim 1, wherein a value of a band gap of the $In_yGa_{1-y}As$ is larger than a value of a band gap of the $In_xGa_{1-x}As$.

5. The multi junction solar cell according to claim 1, wherein $|(LC_A-LC_0)/LC_0| \leq 1 \times 10^{-3}$ and $0.25 \leq |(LC_B-LC_0)/(LC_A-LC_0)| \leq 4.0$ are satisfied where $LC_A$ is a lattice constant of the $In_xGa_{1-x}As$, $LC_B$ is a lattice constant of the $In_yGa_{1-y}As$, and $LC_0$ is a base lattice constant.

6. The multi-junction solar cell according to claim 5, wherein $LC_A-LC_0>0$ and $LC_B-LC_0<0$ are established.

7. The multi junction solar cell according to claim 1, wherein $-1 \times 10^{-3} \leq \{(t_B \cdot LC_B + t_A \cdot LC_A)/(t_B+t_A) - LC_0\}/LC_0 \leq 1 \times 10^{-3}$ is satisfied where $LC_A$ is a lattice constant of the $In_xGa_{1-x}As$, $LC_B$ is a lattice constant of the $In_yGa_{1-y}As$, $LC_0$ is a base lattice constant, $t_A$ is the thickness of the 1-A compound semiconductor layer and the 2-A compound semiconductor layer, and $t_B$ is the thickness of the 1-B compound semiconductor layer and the 2-B compound semiconductor layer.

8. The multi junction solar cell according to claim 1, wherein $0.53<x\leq0.86$ and $0\leq y\leq0.53$ are established.

* * * * *